United States Patent
Hamada et al.

(10) Patent No.: US 9,532,479 B2
(45) Date of Patent: Dec. 27, 2016

(54) INPUT/OUTPUT MODULE

(71) Applicant: YOKOGAWA ELECTRIC CORPORATION, Musashino-shi, Tokyo (JP)

(72) Inventors: Takayuki Hamada, Musashino (JP); Akio Morita, Musashino (JP); Yuusuke Fujitani, Musashino (JP); Ken-ichi Yoshida, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 435 days.

(21) Appl. No.: 14/061,941

(22) Filed: Oct. 24, 2013

(65) Prior Publication Data

US 2014/0118958 A1    May 1, 2014

(30) Foreign Application Priority Data

Oct. 26, 2012 (JP) .................... 2012-236890

(51) Int. Cl.
  *H05K 7/14* (2006.01)
  *G06F 1/16* (2006.01)

(52) U.S. Cl.
  CPC .......... *H05K 7/1468* (2013.01); *H05K 7/1474* (2013.01); *G06F 1/1632* (2013.01)

(58) Field of Classification Search
  CPC .... H05K 7/1468; H05K 7/1474; G06F 1/1632
  See application file for complete search history.

(56) References Cited

U.S. PATENT DOCUMENTS

| | | | | |
|---|---|---|---|---|
| 4,152,750 A | * | 5/1979 | Bremenour | H05K 7/1477 361/679.4 |
| 4,738,632 A | * | 4/1988 | Schmidt | H05K 7/1441 361/729 |
| 5,181,168 A | | 1/1993 | Seitz et al. | |
| 5,253,140 A | * | 10/1993 | Inoue | H05K 7/1468 16/429 |
| 5,302,136 A | * | 4/1994 | St. Germain | H01R 13/631 439/341 |
| 7,865,326 B2 | * | 1/2011 | Johnson | G01D 11/24 361/727 |

(Continued)

FOREIGN PATENT DOCUMENTS

| | | |
|---|---|---|
| JP | 49-145502 U | 12/1974 |
| JP | 2-303094 A | 12/1990 |
| JP | 2009-253051 A | 10/2009 |

*Primary Examiner* — Adrian S Wilson
*Assistant Examiner* — Abhishek Rathod
(74) *Attorney, Agent, or Firm* — Sughrue Mion, PLLC

(57) ABSTRACT

An input/output module is configured to achieve at least one of a function of acquiring a measurement signal from a measurement target and a function of outputting data. The input/output module includes a casing, a rotational connector disposed on the casing, the rotational connector including an arc-shaped notch, the rotational connector being configured to interlock with a connection mechanism of a base to serve as a rotation point so that the input/output module is rotatable to get connected to the base and a latch-shaped fixer configured to fit into a groove formed in at least one of an upper inner surface and a lower inner surface when the input/output module is pushed into a slot having the upper inner surface and the lower inner surface to get connected.

10 Claims, 21 Drawing Sheets

(56) References Cited

U.S. PATENT DOCUMENTS

| | | | | |
|---|---|---|---|---|
| D688,248 S | * | 8/2013 | Tsuda | D14/433 |
| 2004/0032714 A1 | * | 2/2004 | Ice | H05K 7/1404 |
| | | | | 361/679.01 |
| 2006/0187631 A1 | * | 8/2006 | Muenzer | G06F 1/181 |
| | | | | 361/679.32 |
| 2009/0104810 A1 | * | 4/2009 | Matsuzawa | H01R 13/631 |
| | | | | 439/377 |
| 2012/0129368 A1 | * | 5/2012 | Donhauser | H01R 13/516 |
| | | | | 439/137 |
| 2012/0281373 A1 | * | 11/2012 | Bohannon | H05K 7/1489 |
| | | | | 361/756 |

\* cited by examiner

RECORDER CONNECTION USAGE

DATA LOGGER CONNECTION USAGE

STAND ALONE USAGE

FIG. 8A
FIG. 8B
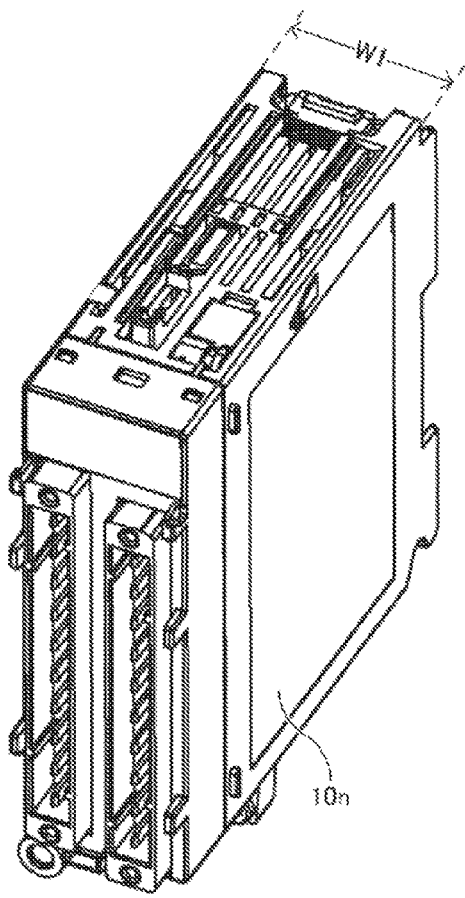
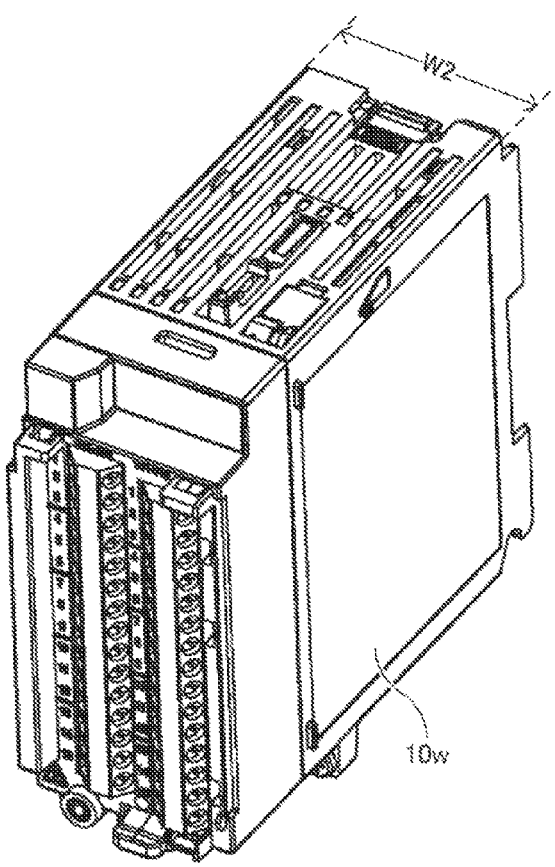

Wb > Wa

PRIOR ART

PRIOR ART

INPUT/OUTPUT MODULE

BACKGROUND OF THE INVENTION

Field of the Invention

The present invention relates to an input/output module, and more particularly, to an input/output module which is configured to be rotated to get connected with a base and allowed to be pushed into a slot to get connected with the slot, where the slot has upper and lower inner surfaces.

Priority is claimed on Japanese Patent Application No. 2012-236890, filed Oct. 26, 2012, the content of which is incorporated herein by reference.

Description of Related Art

A recorder such as a paperless recorder, uses an input/output module to acquire measurement signals from measurement targets. The input/output module includes input/output terminals of a plurality of channels. The input/output module is configured to convert analog measurement signals into digital signals or to perform calculation such as scaling if necessary, and to supply the digital signals to a recorder.

As illustrated in FIG. 20A, a recorder 60 includes a box-shaped casing, and a display device 61 displaying waveforms or the like is disposed on the front surface of the casing. As illustrated in FIG. 20B, a plurality of slots 62 are formed on the rear surface of the casing. By mounting the input/output module 70 on one of the slot 62, the recorder 60 and the input/output module 70 are electrically connected via a connector.

When the input/output module 70 is connected to the recorder 60, for example, as illustrated in FIG. 20C, rotational connection mechanisms disposed on upper portions of connection surfaces of the input/output module 70 and the recorder 60 are first interlocked with each other while the input/output module 70 is inclined. By moving the lower portion of the input/output module 70 close to the recorder 60 using the interlocking portion of the rotational connection mechanisms as a rotation point, the input/output module 70 and the recorder 60 are connected to each other (rotation-connection). Lower portions of the connection surfaces are fixed by screwing, a latch mechanism or the like.

Also, a data logger collecting and storing various kinds of data uses an input/output module to acquire measurement signals from measurement targets. As illustrated in FIG. 21A, a data logger 80 is configured by an input/output module 81, a main module 82 configured to function as a data collection engine, and a power module 83. The input/output module 81, the main module 82, and the power module 83 are connected together via plate-shaped bases 84.

When the input/output module 81 is connected with the base 84, for example, as illustrated in FIG. 21B, rotational connection mechanisms disposed on upper portions of connection surfaces of the input/output module 81 and the base 84 are first interlocked with each other while the input/output module 81 is inclined. By moving the lower portion of the input/output module 81 close to the base 84 using the interlocking portion of the rotational connection mechanisms as a rotation point, the input/output module 81 and the base 84 get connected to each other. Lower portions of the connection surfaces are fixed by screwing, a latch mechanism or the like.

In the related art, the input/output module 70 for a recorder and the input/output module 81 for a data logger are separately designed, and thus the input/output module 70 for the recorder is not compatible with the input/output module 81 for the data logger.

Japanese Unexamined Patent Application, First Application No. 2009-253051 is an example of the related art mentioned above.

SUMMARY OF THE INVENTION

A basic process of acquiring measurement signals from measurement targets or the like is common between the input/output module 70 for the recorder and the input/output module 81 for the data logger. Therefore, if the input/output module is commonly usable to the recorder 60 and the data logger 80, the input/output module is convenient. For example, if the recorder 60 and the data logger 80 are properly used for the same measurement target, it is not necessary to separately install wirings, and thus the input/output module only has to be reconnected with the recorder 60 or the data logger 80.

The input/output module 70 for the recorder is configured to be rotated to get connected with the recorder 60. However, the plurality of devices is closely disposed in upper and lower directions of the recorder 60 in many cases. Therefore, in light of a work space, it is not desirable for the input/output module 70 to protrude from the recorder 60 in the upper and lower directions when the input/output module 70 is connected with the recorder 60.

For this reason, if an opening is formed in the rear surface of the recorder 60 and the input/output module 70 is pushed into the opening to get connected with the recorder 60, the input/output module 70 may be connected with the recorder 60 by guiding the input/output module 70 along the upper inner surface and the lower inner surface of the opening in the horizontal direction. Therefore, there is no problem of the work space. In addition, since a screw or latch fixing mechanism may be disposed near the front surface of the opening, both fixing and detaching of the input/output module 70 may be easily performed.

On the other hand, if the input/output module 81 is connected with the base 84, there is no problem of the work space in the upper and lower directions. However, if the input/output module is pushed into the base 84 to get connected, screw or latch connection fixing mechanisms are required to be formed in the upper and lower portions of the connection surface of the base 84. Therefore, when the plurality of input/output modules 81 are connected laterally, as in FIG. 21A, it is difficult to perform fixing or detaching of the input/output module 81. For this reason, it is desirable for the base 84 and the input/output module 81 to be rotated to get connected as in the related art.

One aspect of the present invention provides an input/output module connectable to both of a rotational connection type base and a slot having upper and lower inner surfaces when the input/output module is commonly usable in a recorder and a data logger.

According to an aspect of the present invention, an input/output module may be configured to achieve at least one of a function of acquiring a measurement signal from a measurement target and a function of outputting data. The input/output module may include a casing, a rotational connector disposed on the casing, the rotational connector including an arc-shaped notch, the rotational connector being configured to interlock with a connection mechanism of a base to serve as a rotation point so that the input/output module is rotatable to get connected to the base, and a latch-shaped fixer configured to fit into a groove formed in at least one of an upper inner surface and a lower inner surface when the input/output module is pushed into a slot having the upper inner surface and the lower inner surface to get connected.

In some cases, the input/output module may further include a positioning rib disposed on at least one of right and left surfaces of the casing, the positioning rib having a first region which has a first height and functions as a positioner in right and left directions when thicknesses of guide walls formed to the right and left of the slot do not vary and a second region which has a second height higher than the first height and functions as a positioner in the right and left directions when the thicknesses of the guide walls are narrowed in an opening direction of the slot.

In the above, the positioning rib may be disposed in each of of the right and left surfaces of the casing.

In the above, the rotational connector may be disposed in an upper or a lower portion of the contact surface of the casing with the base. The positioning rib in the left surface of the casing and the positioning rib in the right surface of the casing may be disposed at positions at which distances from the rotation point to the positioning rib in the left surface and the positioning rib in the right surface are different and the positioning rib in the left surface and the positioning rib in the right surface do not overlap each other.

In some cases, when a width of the slot is larger than a width of the input/output module, an adapter with a thickness fitting to a difference between the width of the input/output module and the width of the slot is mountable on a side surface of the casing.

In some cases, the input/output module may further include a base contact configured to enable the input/output module to independently stand vertically in cooperation with another base contact of the base when the input/output module is connected to the base.

In the above, a space may be formed in a lower portion by the base contact of the input/output module and the other base contact of the base when the input/output module independently stands vertically.

In some cases, the base contact of the input/output module may include a screwing member with a shape fitted into a positioning enclosure formed in a lower side of the lower inner surface of the slot when the input/output module is pushed into the slot to get connected.

In some cases, the input/output module may further include a connector configured to electrically connect with the base. The connector may include a ground line, a power line, and a signal line which are arranged upwardly in their order when the rotational connector is disposed in a lower portion of the contact surface of the casing with the base, and the connector may include the ground line, the power line, and the signal line which are arranged downwardly in their order when the rotational connector is disposed in an upper portion of the contact surface of the casing with the base.

In some cases, the input/output module may include a long plate of which one end is fixed, the long plate being disposed on at least one of the upper surface and the lower surface of the casing. The fixer may be disposed on the long plate. The long plate may include a supporter which is closer to the contact surface of the casing with the base than the fixer and is configured to serve as a rotation point, and a pusher for unfixing which is disposed farther from the contact surface of the casing with the base than the fixer.

According to another of the present invention, an input/output module may be configured to achieve at least one of a function of acquiring a measurement signal from a measurement target and a function of outputting data. The input/output module may include a casing and a positioning rib disposed on at least one of right and left surfaces of the casing. The input/output module may be pushed into a slot having an upper inner surface and a lower inner surface to get connected. The positioning rib may have a first region which has a first height and functions as a positioner in right and left directions when thicknesses of guide walls formed to the right and left of the slot do not vary, and a second region which has a second height higher than the first height and functions as a positioner in the right and left directions when the thicknesses of the guide walls are narrowed in an opening direction of the slot.

In some cases, the positioning rib may be disposed in each of the right and left surfaces of the casing.

In the above, the input/output module may include a rotational connector disposed on a contact surface of the casing with a base, the rotational connector including an arc-shaped notch, the rotational connector may be configured to interlock with a connection mechanism of the base to serve as a rotation point so that the input/output module is rotatable to get connected to the base.

In the above, the positioning rib in the left surface of the casing and the positioning rib in the right surface of the casing may be disposed at positions at which distances from the rotation point to the positioning rib in the left surface and the positioning rib in the right surface are different and the positioning rib in the left surface and the positioning rib in the right surface do not overlap each other.

According to one aspect of the present invention, an input/output module connectable to both of a rotational connection type base and a slot having upper and lower inner surface is provided.

BRIEF DESCRIPTION OF THE DRAWINGS

FIG. 8A is a diagram illustrating input/output modules with one width.

FIG. 8B is a diagram illustrating input/output modules with another width.

DETAILED DESCRIPTION OF THE INVENTION

Figure 1A:
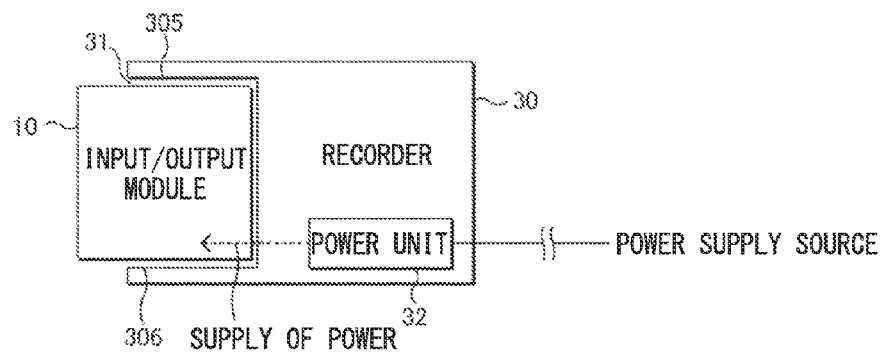
FIG. 1A is a diagram illustrating usage of an input/output module according to an embodiment.
Figure 1B:
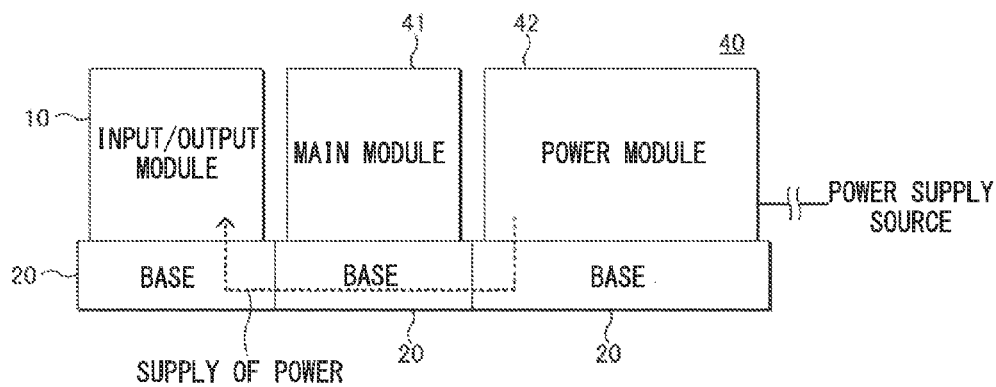
FIG. 1B is a diagram illustrating usage of the input/output module according to the embodiment.
Figure 1C:
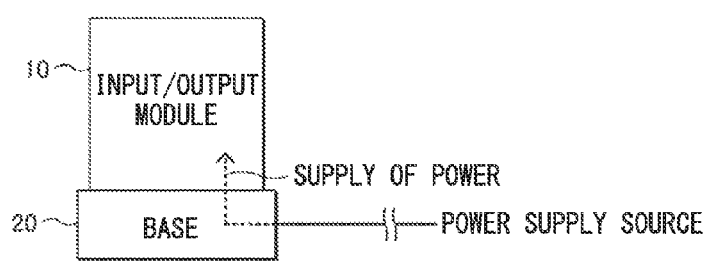
FIG. 1C is a diagram illustrating usage of the input/output module according to the embodiment.

An embodiment of the present invention will be described with reference to the drawings. FIGS. 1A to 1C are diagrams illustrating usage of an input/output module according to this embodiment. As illustrated in FIGS. 1A to 1C, three usage may be realized in an input/output module 10 according to this embodiment. That is, a recorder connection usage illustrated in FIG. 1A, a data logger connection usage illustrated in FIG. 1B, and a stand alone usage illustrated in FIG. 1C may be realized. The input/output module 10 may unnecessarily have both of input and output functions and may include at least one of a function of acquiring a measurement signal from a measurement target and a function of outputting data.

In the case of the recorder connection usage illustrated in FIG. 1A, the input/output module 10 is pushed into a slot to get connected with the slot formed in an opening 31 that has an upper inner surface 305 and a lower inner surface 306. The input/output module 10 is supplied with a power voltage from a power unit 32 of the recorder 30 to operate. For example, the power unit 32 of the recorder 30 generates a power voltage from a commercial alternating-current power supply.

In the case of the data logger connection usage illustrated in FIG. 1B, rotational connection mechanisms disposed on connection surfaces of the input/output module 10 and the base 20 are interlocked with each other while the input/output module 10 is inclined. By moving the input/output module 10 close to the base 20 using the interlocking portion of the rotational connection mechanisms as a rotation point, the input/output module 10 and the base 20 are connected to each other (rotation-connection). A data logger 40 is configured so that the input/output module 10 is rotatable to get connected with a base 20 and is connected to each of a main module 41 and a power module 42 via the base 20. The input/output module 10 is supplied with a power voltage from the power module 42 to operate. For example, the power module 42 is configured to generate the power voltage from a commercial alternating-current power supply.

In the case of the stand alone usage illustrated in FIG. 1C, the rotational connection mechanisms disposed on the connection surfaces of the input/output module 10 and the base 20 are interlocked with each other while the input/output module 10 is inclined. By moving the input/output module 10 close to the base 20 using the interlocking portion of the rotational connection mechanisms as a rotation point, the input/output module 10 and the base 20 are connected to each other (rotation-connection). At this case, the configuration made by connecting the input/output module 10 and the base 20 includes a mechanism to allow the configuration to stand alone vertically and to route wirings easily. The input/output module 10 is supplied with the power voltage from a power supply source such as a field power supply via the base 20 to operate. The power voltage may be supplied via a power module (not illustrated).

Figure 2:
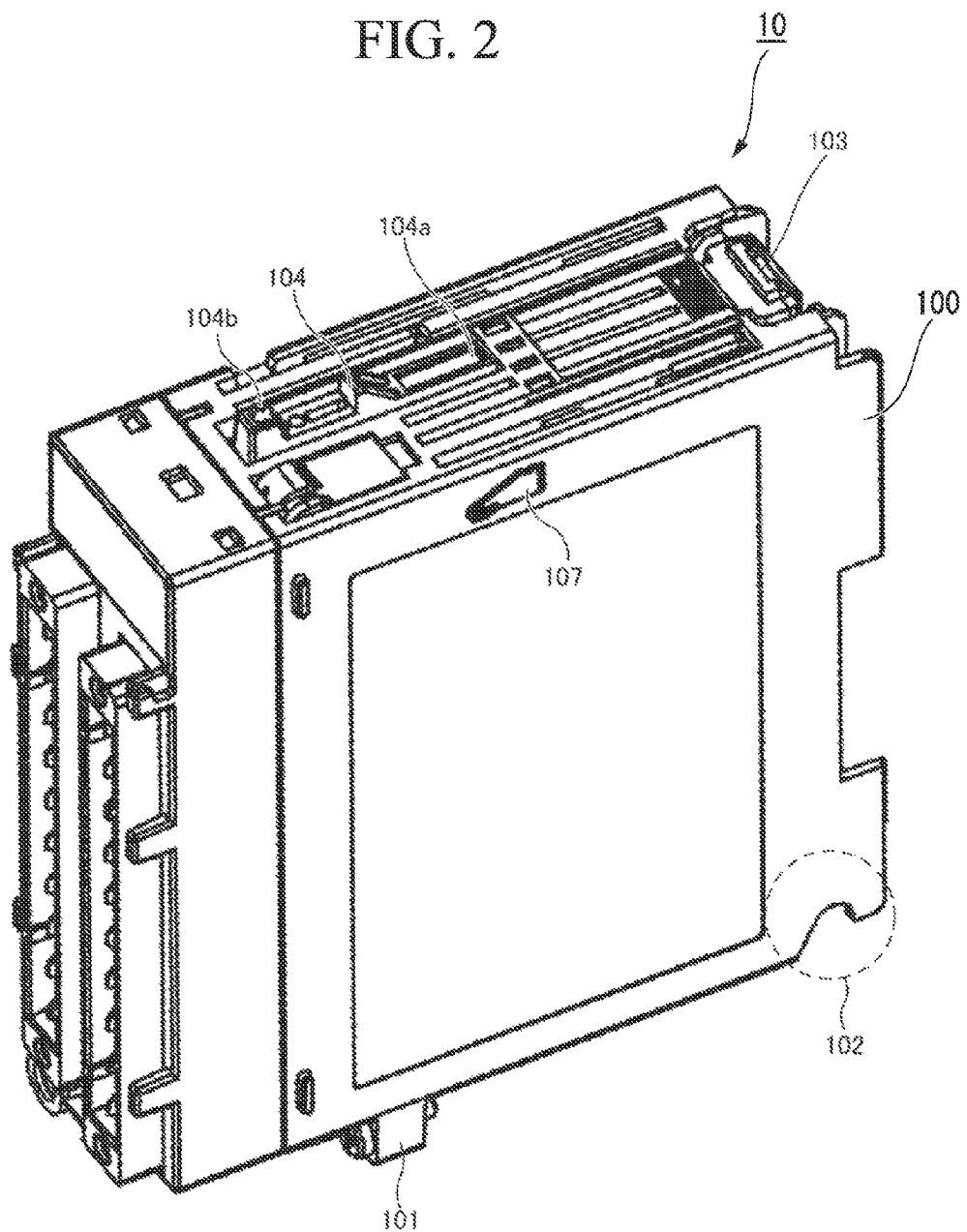
FIG. 2 is a perspective view illustrating the front right surface of the exterior of the input/output module.

FIG. 2 is a perspective view illustrating the front right surface of the exterior of the input/output module 10 according to this embodiment. In FIG. 2, the left end of the input/output module 10 is the front surface having a terminal group to which measurement signals are input and the right end is a connection side with the recorder 30 or the base 20.

As illustrated in FIG. 2, the input/output module 10 includes a casing 100, and a base contact 101 on the front of the lower surface of the casing 100. The input/output module 10 includes a plate-shaped rotational connector 102 in which a semicircular notch is formed in the lower right and left portions on the connection side of the casing 100 and includes an upper rear fixer 103 with a convex shape on the upper surface on the connection side. The input/output module 10 may include the rotational connector 102 in the upper right and left portions on the connection side of the casing 100. Hereinafter, the configuration that the input/output module 10 includes the rotational connector 102 in the lower right and left portions on the connection side of the casing 100 is described. The upper rear fixer 103 may be pushed downward. An upper front fixer 104 with a convex shape is formed on the upper surface of the front of the casing 100. A right positioning rib 107 serving as a right positioning guide at the time of the pushing into the slot is formed in the upper portion of the right outer surface. A front fixer with a convex shape may be formed on the lower surface of the casing 100. Hereinafter, the configuration that the upper front fixer with a convex shape is formed on the upper surface of the casing 100 is described.

The rotational connector 102 serves as a rotation point by interlocking with a connection mechanism of the base 20 at the time of the rotational connection with the base 20. The upper rear fixer 103 functions as a latch fitted into a fixer having an opening formed in the base 20 when the input/output module is connected to the base 20. The upper front fixer 104 serves as a latch fitted into a groove formed in the upper inner surface when the input/output module is pushed into the slot to get connected to the slot that has the upper and lower inner surfaces of the recorder 30.

The upper front fixer 104 is formed on a long plate of which one end is fixed, and thus may be pushed downward. In the long plate, a supporter 104a serving as a rotation point is disposed on one side closer to the contact surface with the base than the upper rear fixer 103 and a pusher 104b for latch release is disposed on the other side farther from the contact surface with the base than the upper front fixer 104. Therefore, by pressing the pusher 104b farther from the contact surface with the base than the upper front fixer 104 downward, a convex of the upper front fixer 104 is configured to sink downward. The convex has a triangular shape with an inclined surface on the rear and a vertical surface on the front.

Figure 3:
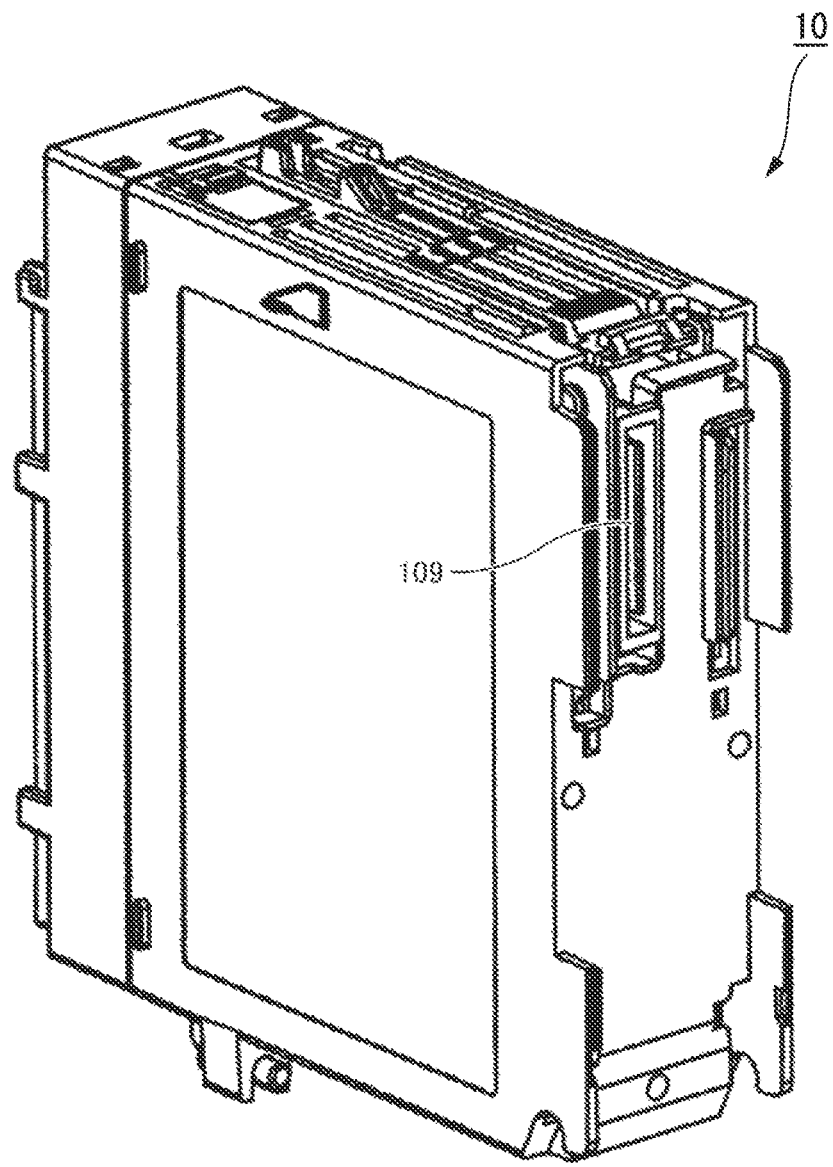
FIG. 3 is a perspective view illustrating a connection surface of the input/output module.

FIG. 3 is a perspective view illustrating a connection surface of the input/output module 10. As illustrated in FIG. 3, a connector 109 for electrically connecting to the recorder 30 or the base 20 is formed on the connection surface of the input/output module 10.

Figure 4:
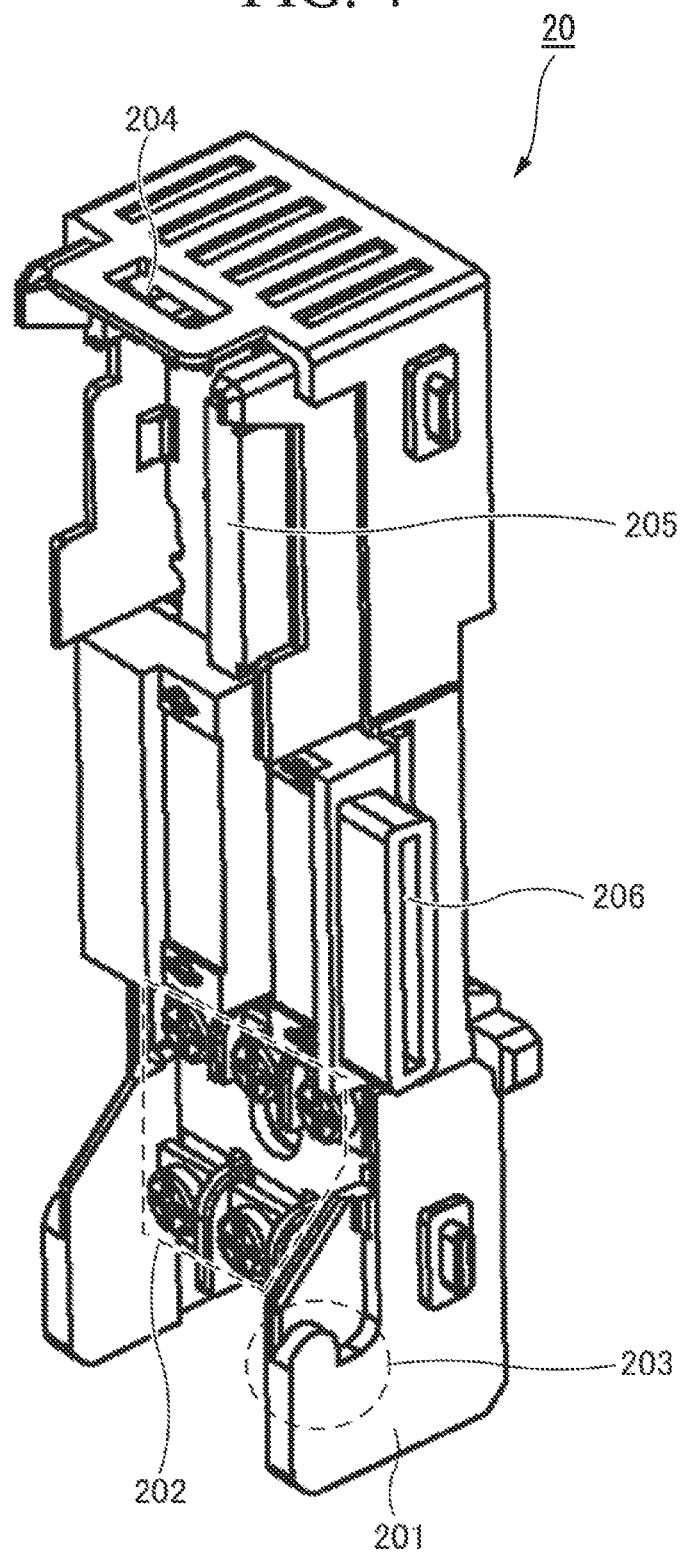
FIG. 4 is a perspective view when a base is viewed from a connection surface side.

FIG. 4 is a perspective view when the base 20 is viewed from a connection surface side. As illustrated in FIG. 4, the base 20 includes a base contact 201 in the right and left lower portions. In the base contact 201, a base rotational connector 203 with an arc-shaped notch is formed to interlock with the rotational connector 102 of the input/output module 10. A base connector 205 is disposed on the connection surface to the input/output module 10.

The base 20 includes a terminal group 202 in the lower portion on the connection side to the input/output module 10. A base upper fixer 204 having an opening is formed on the upper surface. Base connectors 206 used to connect with the bases 20 each other are formed on the side surfaces thereof.

Figure 5A:
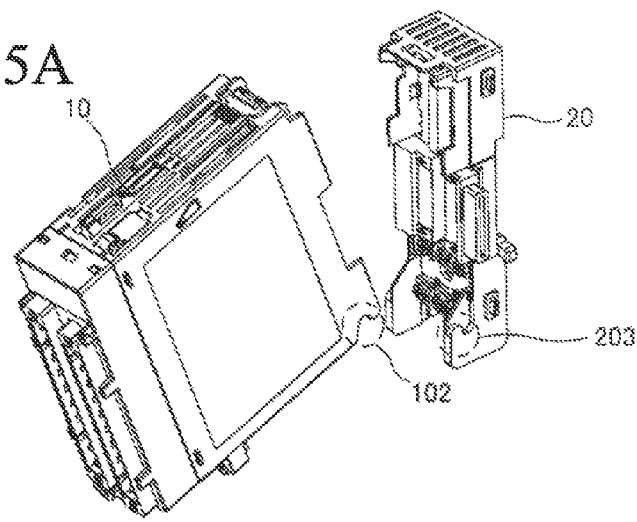
FIG. 5A is a diagram illustrating an order of connection with the base.
Figure 5B:
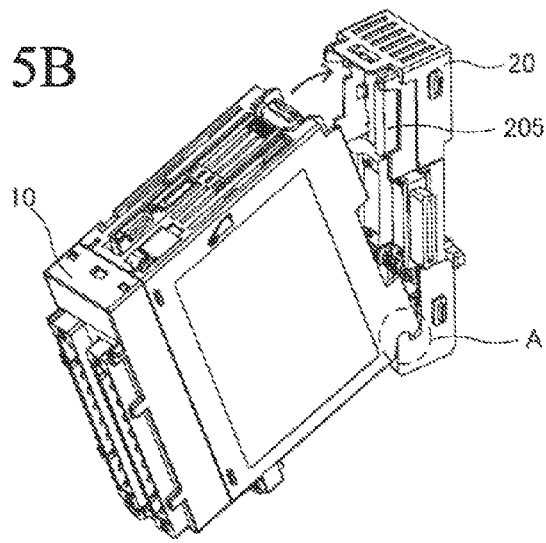
FIG. 5B is a diagram illustrating an order of connection with the base.
Figure 5C:
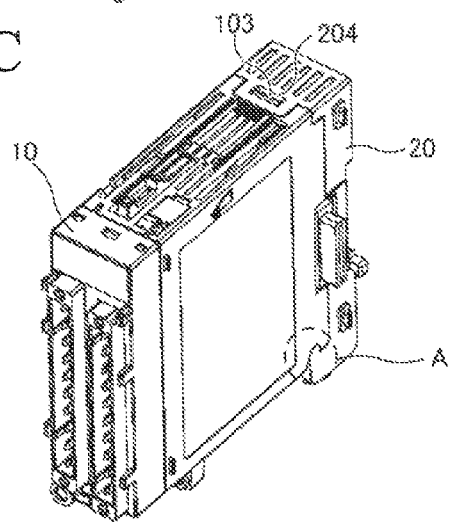
FIG. 5C is a diagram illustrating an order of connection with the base.

FIGS. 5A to 5C are diagrams for describing the connection between the input/output module 10 and the base 20. As illustrated in FIG. 5A, when the input/output module 10 is connected to the base 20, the rotational connector 102 of the input/output module 10 is first interlocked with the base rotational connector 203 in an oblique direction. Then, as illustrated in FIG. 5B, the input/output module 10 gets connected to the base 20 by rotating the input/output module 10 so that the upper surface of the input/output module 10 becomes close to the base 20 using the interlocked portion as a rotation point. In this state, as illustrated in FIG. 5C, the input/output module 10 is fixed to the base 20 by fitting the convex of the upper rear fixer 103 into the opening of the base upper fixer 204. At this time, the connector 109 of the input/output module is connected to the base connector 205 of the base 20.

To rotate the input/output module 10 using the interlocked portion of the rotational connector 102 and the base rotational connector 203 as the rotation point, the connection is performed sequentially from pins of the lower portions of the connector 109 and the base connector 205 when the input/output module 10 is connected to the base 20. Therefore, in order to prevent noise from occurring at the time of the connection and the time of disconnection, the pins of each of the connector 109 and the base connector 205 are arranged so that a ground, a power source, and a signal line are arranged upwardly in their order. Thus, it is possible to deal with hot swapping. When the input/output module 10 includes the rotational connector 102 in the upper right and left portions on the connection side of the casing 100 and the input/output module 10 is connected to the base 20, the connection is performed sequentially from pins of the upper portions of the connector 109 and the base connector 205. Therefore, the pins of the connector 109 and the base connector 205 are arranged so that a ground, a power source, and a signal line are arranged downwardly in their order.

Figure 6A:
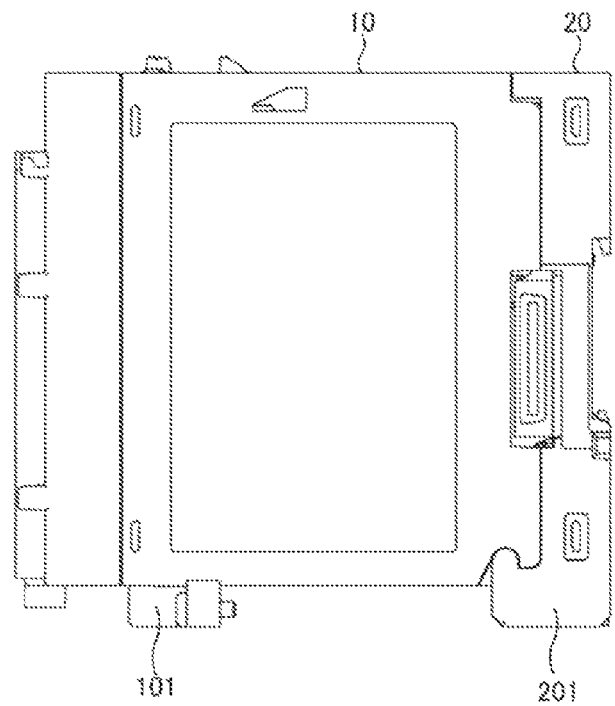
FIG. 6A is a diagram illustrating a state of the connection with the base.
Figure 6B:
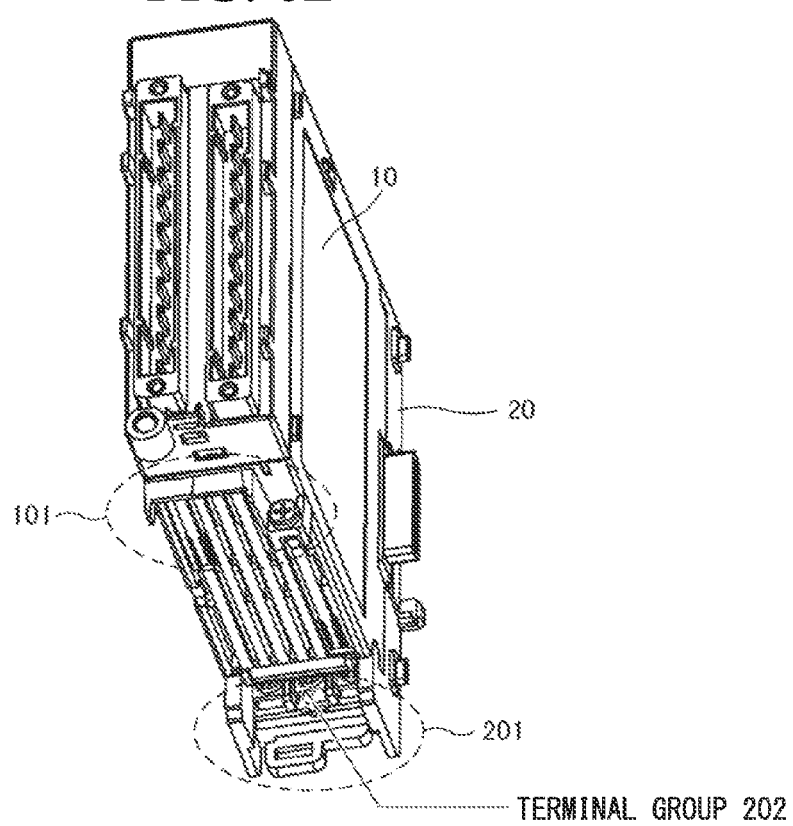
FIG. 6B is a diagram illustrating a state of the connection with the base.

FIGS. 6A and 6B are diagrams illustrating a connection state of the input/output module 10 and the base 20. FIG. 6A is a right-surface view and FIG. 6B is a perspective view of the lower surface. As illustrated in FIGS. 6A and 6B, the input/output module 10 may independently stand vertically due to the base contact 101 of the input/output module 10 in cooperation with the base contact 201. Therefore, at the time of the stand alone usage, the input/output module 10 may be placed vertically, and thus an installation place may be effectively utilized and the outer appearance thereof is improved.

When the input/output module 10 is placed vertically at the time of the stand alone usage, a space is formed in a lower portion by the base contact 101 of the input/output module 10 and the base contact 201. Cables connected to the terminal group 202 may be arranged in the space. Therefore, even when the input/output module 10 is straightly placed, wirings may be easily routed on front, rear, right, and left sides, and thus convenience is improved.

Figure 7:
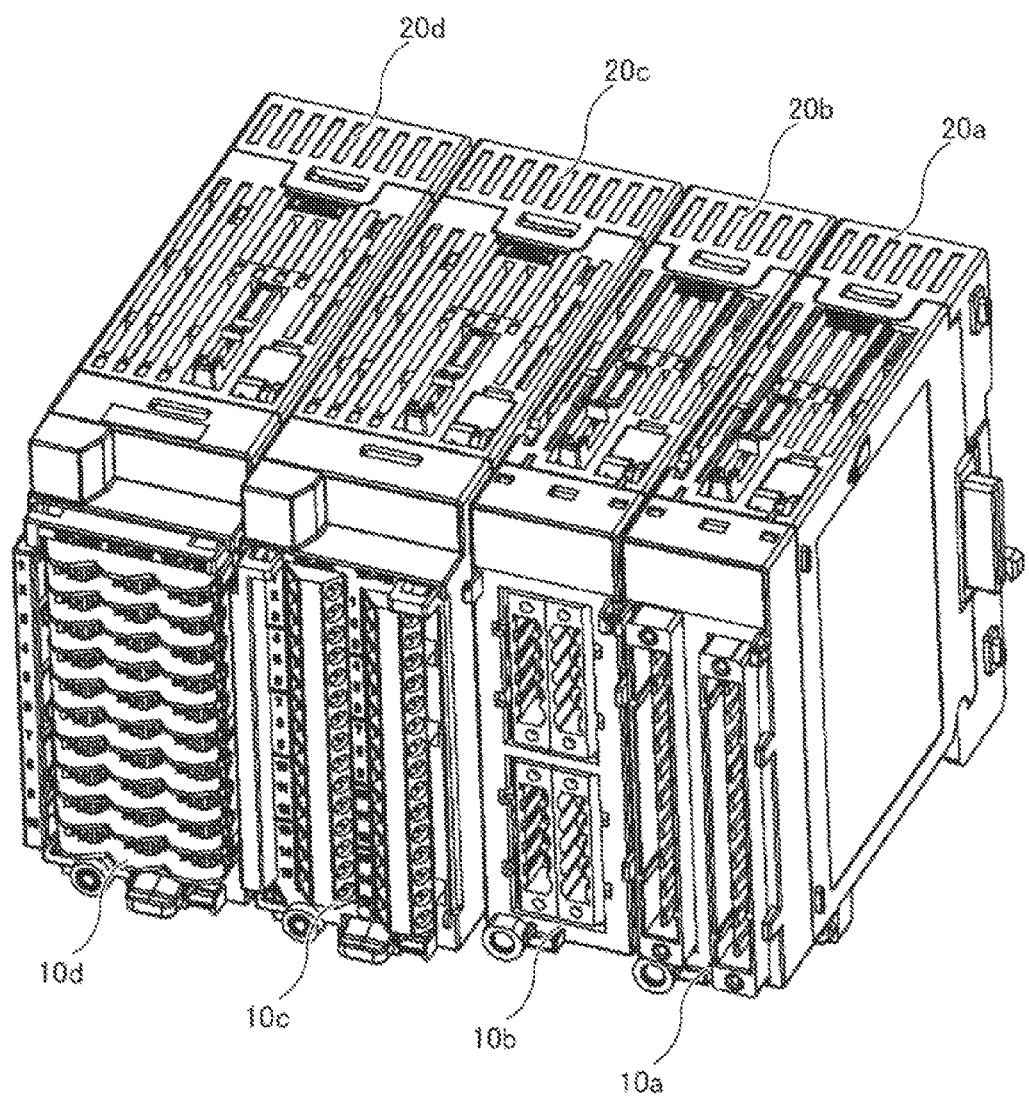
FIG. 7 is a diagram illustrating the input/output modules connected each other via the base.

The base connectors 206 disposed on the side surfaces of each base 20 are used to connect the plurality of input/output modules 10 connected to the base 20, as illustrated in FIG. 7. In the example illustrated in FIG. 7, four input/output modules 10a to 10d are connected via the bases 20a to 20d. In FIG. 7, of the four input/output modules 10a to 10d, the input/output modules 10c and 10d have a larger width than the input/output modules 10a and 10b.

Figure 20A:
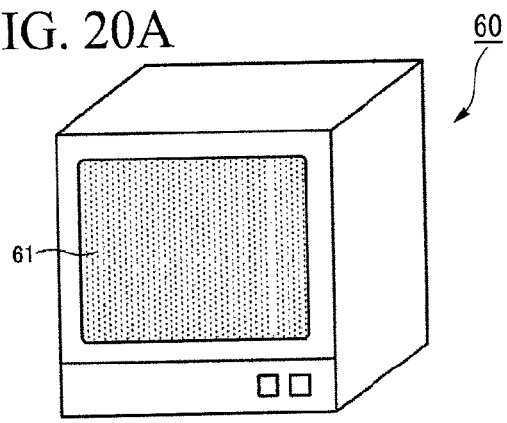
FIG. 20A is a diagram illustrating the exterior of a recorder according to the related art.
Figure 20B:
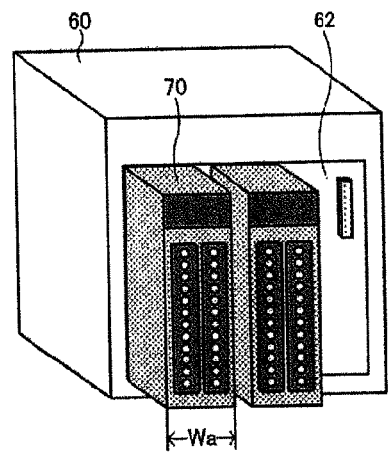
FIG. 20B is a diagram illustrating the exterior of the recorder according to the related art.
Figure 20C:
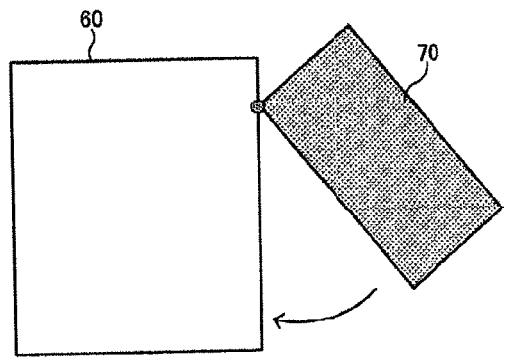
FIG. 20C is a diagram illustrating the exterior of the recorder according to the related art.
Figure 21A:
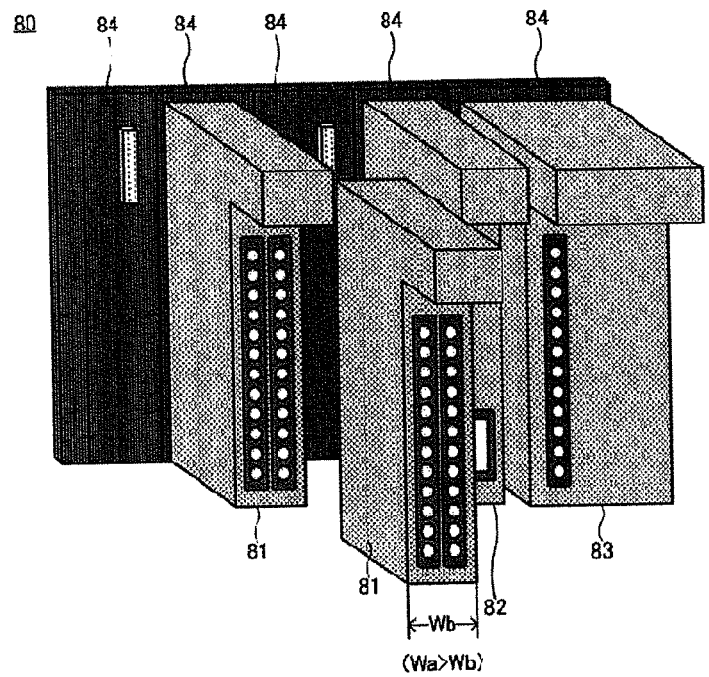
FIG. 21A is a diagram illustrating the exterior of a data logger according to the related art.
Figure 21B:
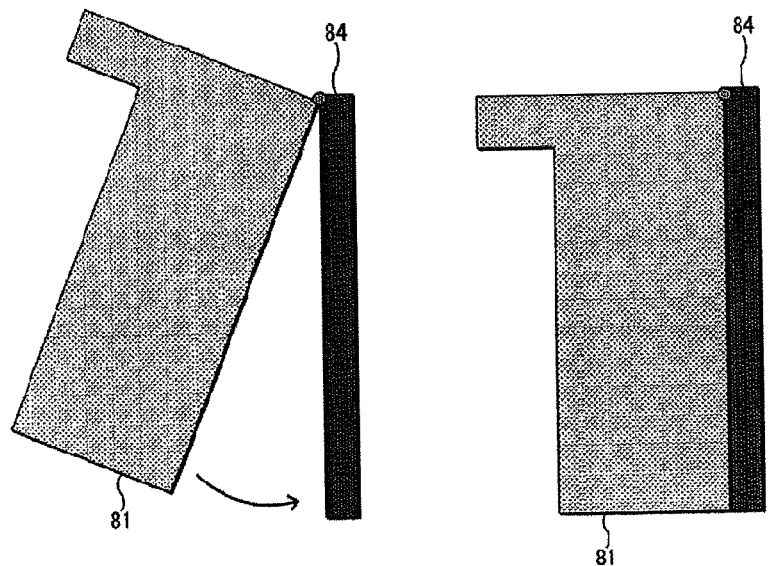
FIG. 21B is a diagram illustrating the exterior of the data logger according to the related art.

As illustrated in FIGS. 20B and 21A, a width Wa of an input/output module 70 for a recorder 60 is generally designed to be wider than a width Wb of an input/output module 81 for a data logger 80 in the related art. When the input/output module 10 is commonly used in the recorder 30 and the data logger 40 and the width of the input/output module 10 is adjusted to the width of the input/output module 70 of the recorder 60 according to the related art, an additional space will be necessary for installation in the data logger connection use. On the other hand, when the width of the input/output module 10 is unified to the width of the input/output module 81 for the data logger 80 according to the related art, there is a concern that all of the constituent elements necessary in the input/output module 70 for the recorder 60 may not be mounted.

In this embodiment, the input/output modules 10 with different widths are realized. Here, for the sake of simplicity, two different widths, a large width and a narrow width, are adopted. The input/output module 10 which has a function of fitting into a narrow width has a narrow width, so that an additional space is efficiently utilized for the data logger use. On the other hand, if the width of the input/output module 10 is insufficient to mount the function due to a constitution of the narrow width, adapting the large width will allow the input/output module 10 to mount a necessary function. FIG. 8A illustrates an input/output module 10n with a width W1 which is a narrow width. FIG. 8B illustrates an input/output module 10w with a width W2 which is a large width.

Figure 9:
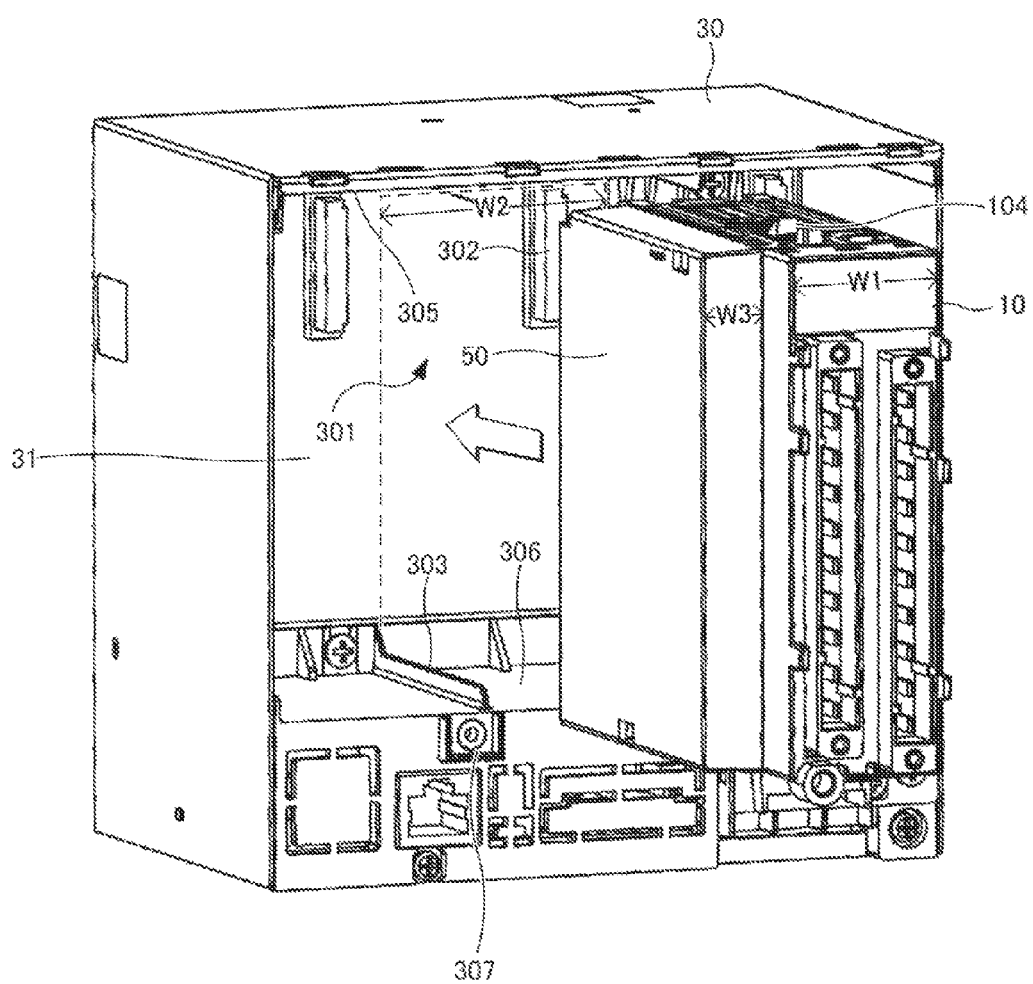
FIG. 9 is a diagram for describing connection of a recorder with a slot.

FIG. 9 is a diagram for describing the connection between the input/output module 10 and the recorder 30 in the recorder connection use. As illustrated in FIG. 9, the opening 31 having the upper inner surface 305 and the lower inner surface 306 is formed in the recorder 30. A plurality of slots 301 including a connector 302 are formed in the opening 31. In the boundaries of the adjacent slots 301, rib-shaped guide walls 303 are formed on the upper inner surface 305 and the lower inner surface 306 of the opening 31. The guide walls 303 serve as a positioning guide when the input/output module 10 is drawn and inserted. A positioning enclosure 307 in which the lower side of the input/output module 10 is positioned is formed on a wall on the lower side of the opening 31. The positioning enclosure 307 has an angled "U" shape with walls on three sides, excluding the side coming into contact with the lower inner surface 306, and a screw hole is formed in its center.

The width of the slot 301 of the recorder 30 fits to the width W2 of the input/output module 10 with the large width. When the input/output module 10 with the width W1 which is the narrow width is connected with the slot 301 with the width W2, in other words, when the width of the slot 301 is larger than the width of the input/output module 10, a difference in width between the width W1 and W2 is compensated by mounting an adapter 50 with a thickness W3, which is a difference between the width W2 and the width W1, on a side surface of the input/output module 10. Thus, since the adapter 50 and the guide walls 303 come into contact with each other, the guide walls 303 on both right and left sides function as guides to prevent right and left backlash of the input/output module 10.

Figure 10:
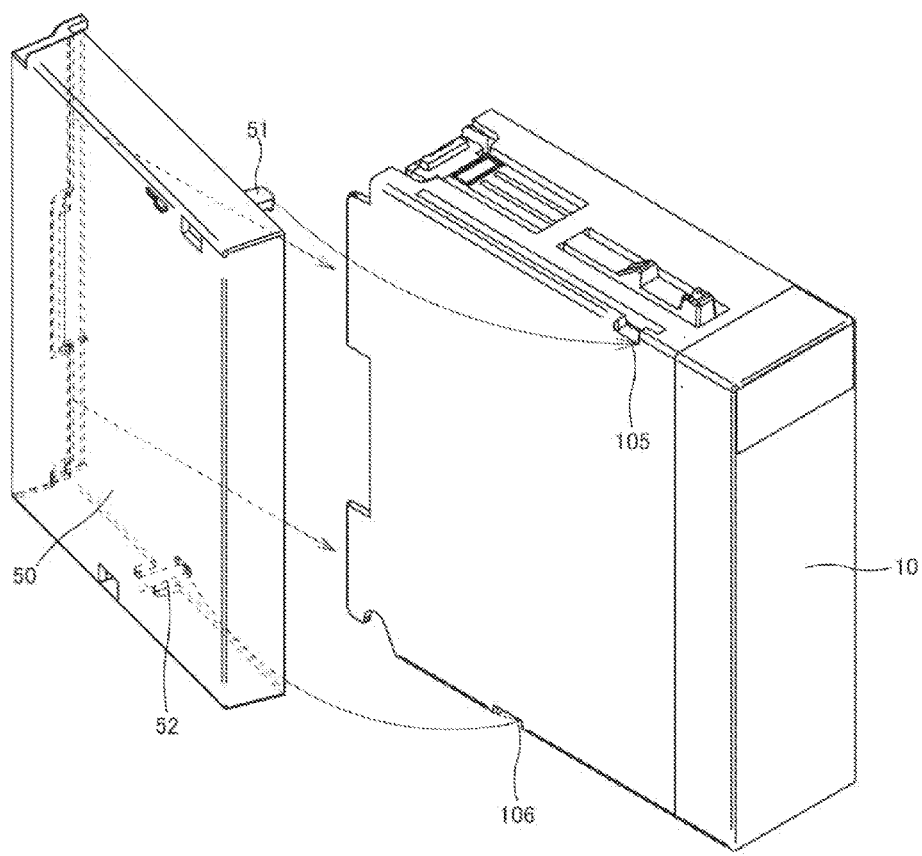
FIG. 10 is a diagram for describing mounting of an adapter.

As illustrated in FIG. 10, an upper claw 51 and a lower claw 52 formed in the upper and lower portions of a side surface of the adapter 50 for width adaption are fitted into a side-surface upper groove 105 and a side-surface lower groove 106 formed on a side surface of the input/output module 10, respectively, to be mounted and fixed to the input/output module 10.

Figure 11:
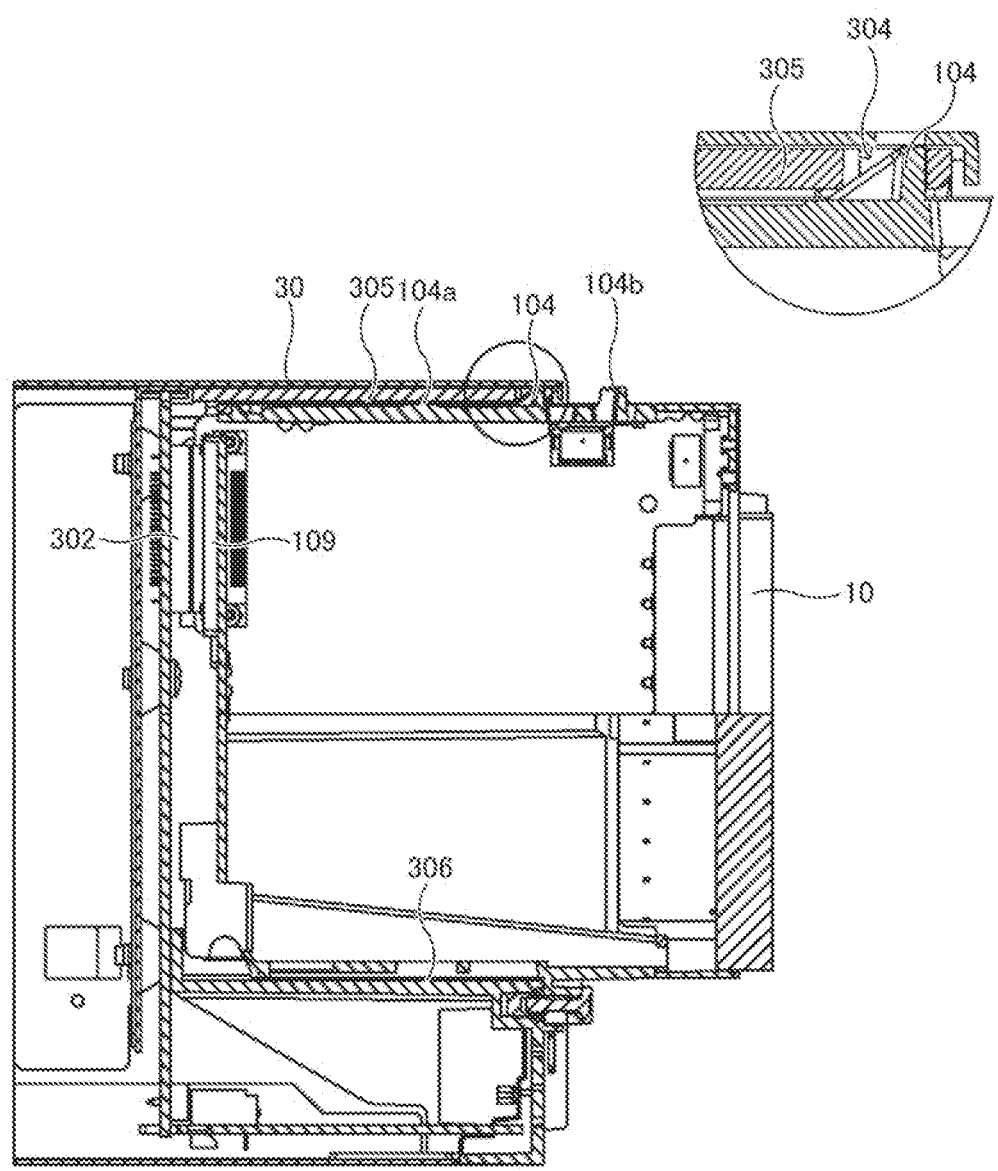
FIG. 11 is a diagram illustrating an upper surface front fixer.

When the input/output module 10 is inserted up to the rear portion of the slot 301, as illustrated in the sectional view of FIG. 11, the connector 109 of the input/output module 10 is connected to the connector 302 of the recorder 30. The convex of the upper front fixer 104 is fitted into an upper groove 304 formed on the upper inner surface 305 of the opening 31, so that the upper side is fixed. The input/output module 10 is screwed to the recorder 30 in the positioning enclosure 307 on the lower side of the opening 31, so that the lower side is fixed. As illustrated in FIG. 6B, a part of the base contact 101 of the input/output module 10 functions as a screwing member. This screwing member is fitted into the positioning enclosure 307 so that the slip in the right, left, and lower directions is suppressed. Further, screwing may be easily performed. The positioning enclosure 307 may be a divided wall or a semicircular wall when positioning in the right, left, and lower directions may be realized. In this case, a screwing member of the input/output module 10 is adapted to the shape.

The convex of the upper front fixer 104 has a surface with a vertical shape on the front and may be pushed downward through an operation of the pusher 104b, which is farther from the contact surface of the base, using the supporter 104a, which is closer to the contact surface of the base, as the rotation point. Therefore, when the convex is fitted into the upper groove 304, the input/output module 10 is configured so that the resistance in the drawing direction is strong and the convex does not easily fall off.

Thus, in order to facilitate fixing or unfixing through an operation from the front, the input/output module 10 is configured to be pushed into the slot 301 to get connected to the slot 301 having the upper inner surface 305 and the lower inner surface 306. Further, by fixing the upper portion by a latch and fixing the lower portion by a screw, the upper portion is designed so that space is saved and the outer appearance is improved.

Figure 12A:
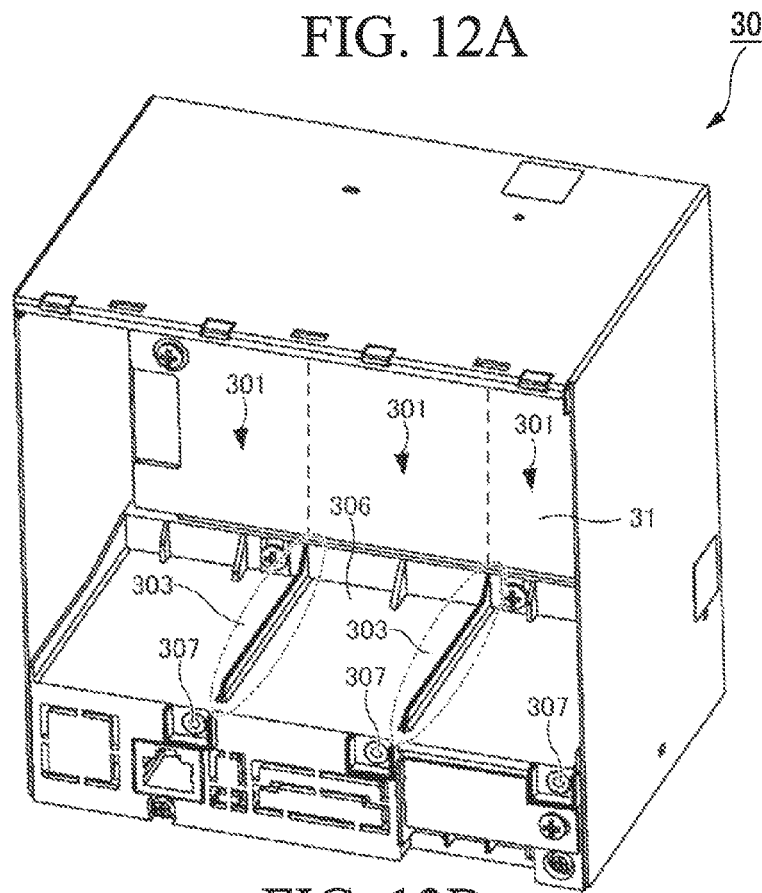
FIG. 12A is a diagram illustrating guide walls.
Figure 12B:
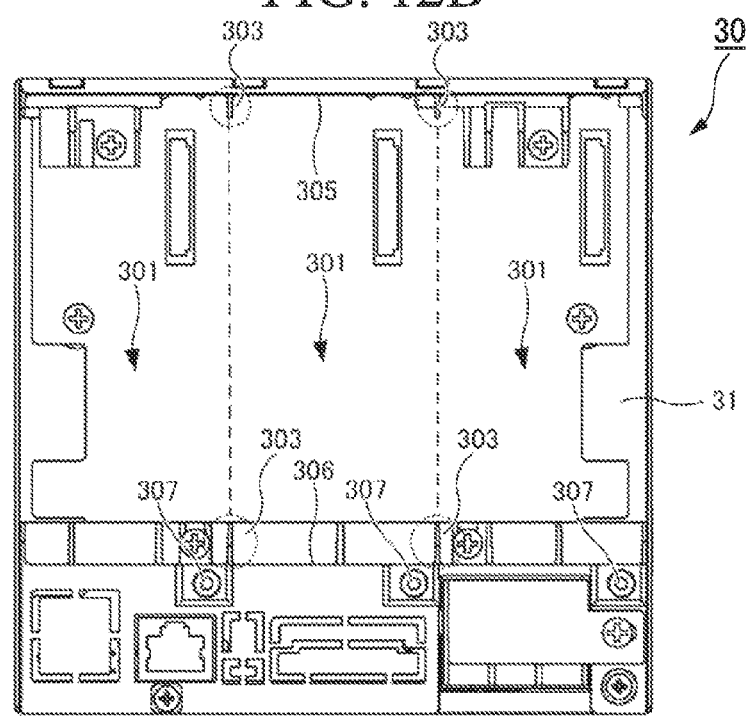
FIG. 12B is a diagram illustrating the guide walls.
Figure 13A:
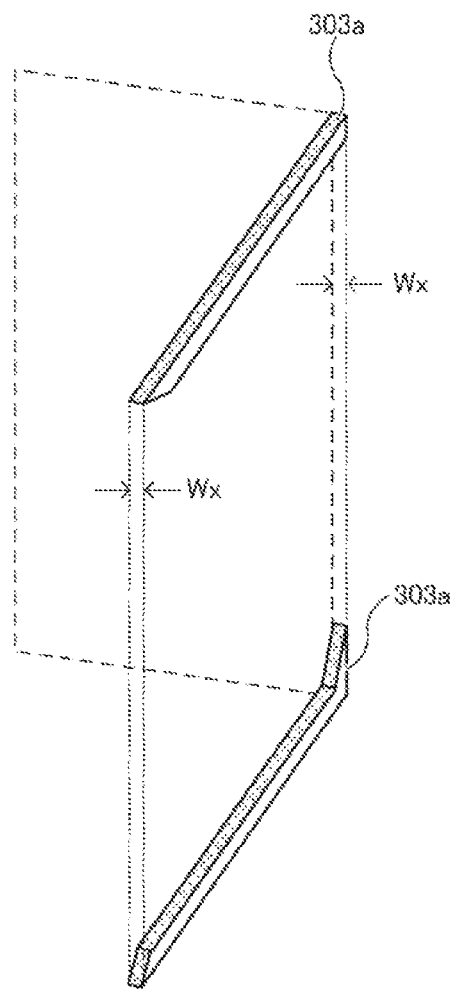
FIG. 13A is a diagram illustrating two kinds of guide walls.
Figure 13B:
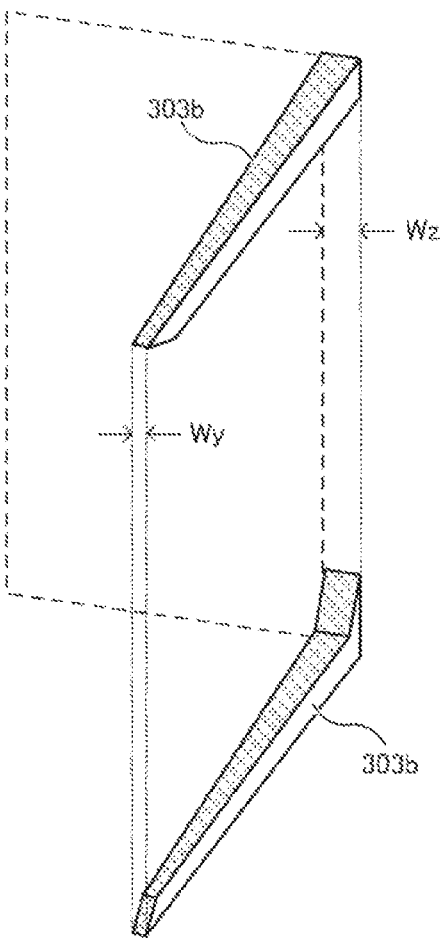
FIG. 13B is a diagram illustrating two kinds of the guide walls.

As illustrated in the perspective view of FIG. 12A and a front view of FIG. 12B, the slots 301 are partitioned and the rib-shaped guide walls 303 serving as guides at the time of the drawing and inserting of the input/output module 10 are formed on the upper inner surface 305 and the lower inner surface 306 of the opening 31 of the recorder 30. According to a resin molding condition, as the guide walls 303, there are two kinds of a guide wall 303a of which a thickness does not vary in the opening direction of the slot 301 as illustrated in FIG. 13A, and a guide wall 303b of which a thickness is narrowed in the opening direction of the slot 301 as illustrated in FIG. 13B, for each casing. This is because it is necessary to provide a draft angle when the guide walls are molded as an integrated type.

Figure 13C:
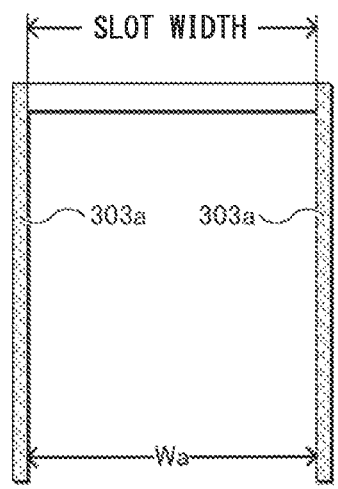
FIG. 13C is a diagram illustrating two kinds of the guide walls.
Figure 13C:
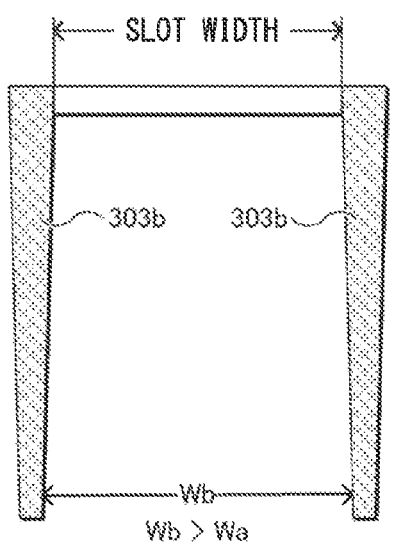

Since the width of the supporter between the adjacent guide walls 303 is identical with the width of the slot 301, as illustrated in FIG. 13C, a gap Wb between the guide walls 303b on the inner side of the opening 31 is larger than a gap Wa between the guide walls 303a. That is, a deviation width of the right and left of the input/output module 10 is larger to that extent.

As illustrated in FIG. 2, the right positioning rib 107 serving as a right positioning guide when the input/output module 10 is pushed into the slot 301 to get connected is formed in the upper portion of the right surface of the input/output module 10. The right positioning rib 107 may fit to both of the guide wall 303a of which the thickness does not vary and the guide wall 303b of which the thickness varies.

Figure 14:
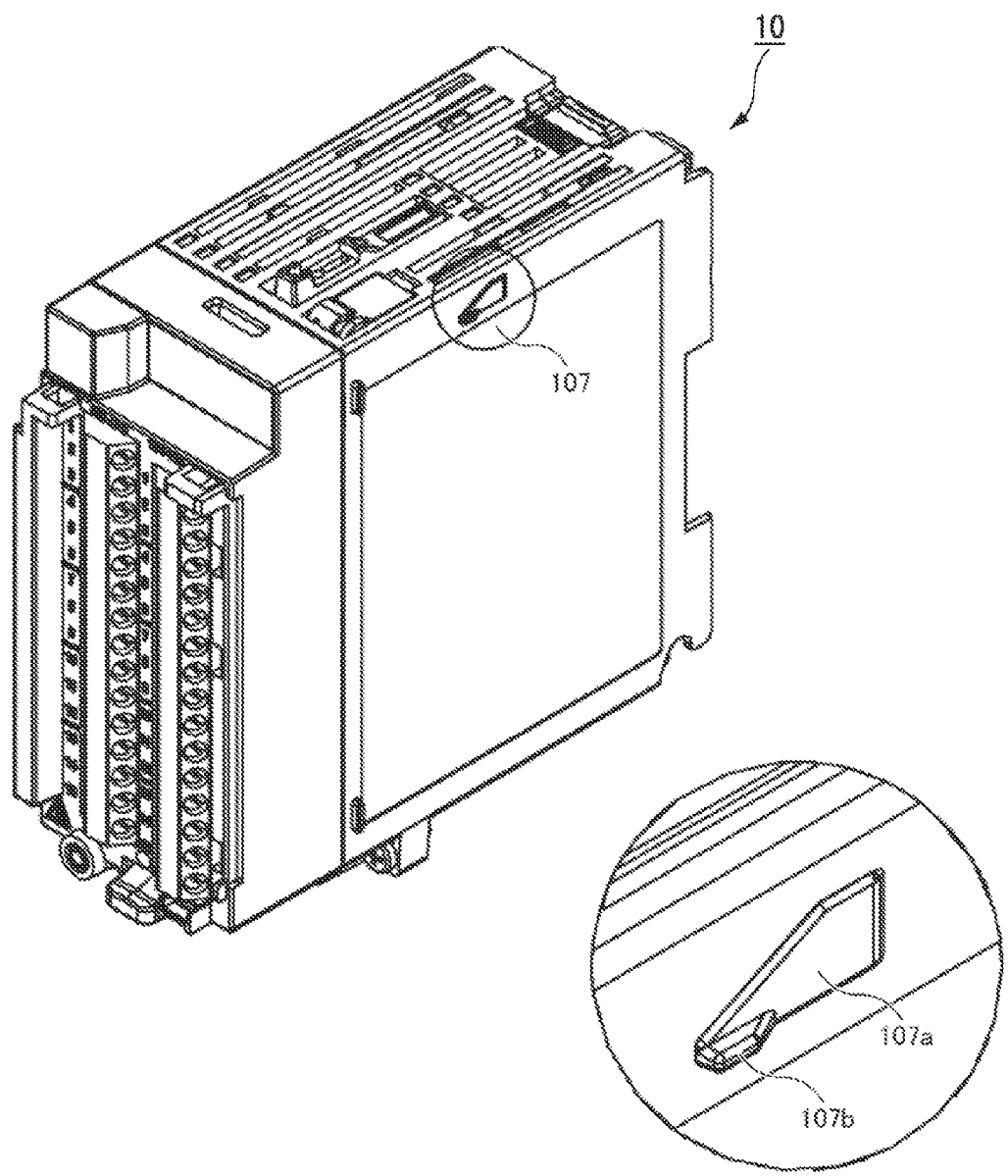
FIG. 14 is a diagram illustrating a right positioning rib.

As illustrated in FIG. 14, the right positioning rib 107 has a region 107a with a height fitting to the guide wall 303a of which the thickness does not vary and a region 107b with a height corresponding to the guide wall 303b of which thickness is narrowed in the opening direction. Here, a large deviation in width is compensated by setting the height of the region 107b to be higher than the height of the region 107a.

Figure 15:
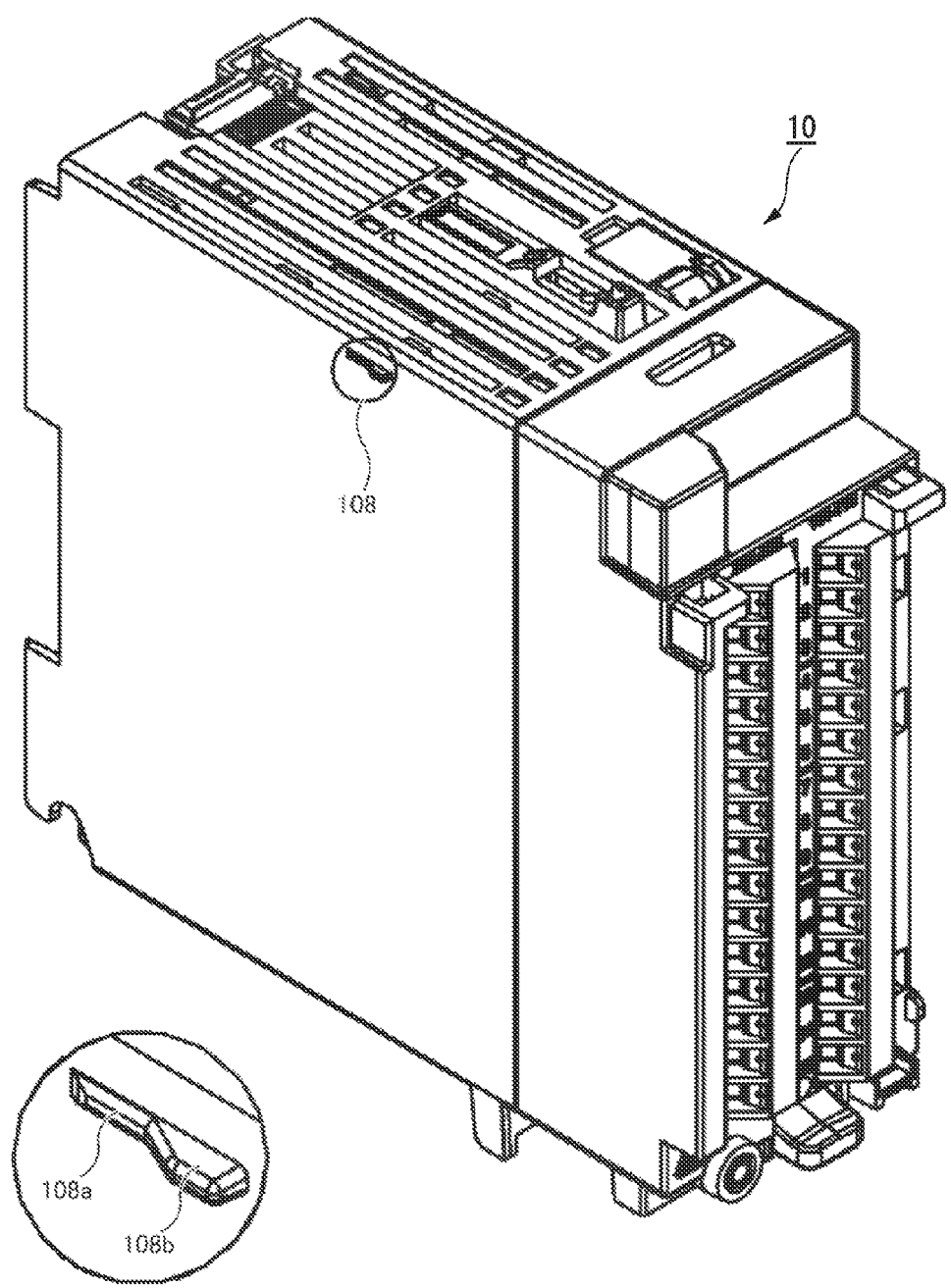
FIG. 15 is a diagram illustrating a left positioning rib.

As illustrated in FIG. 15, a left positioning rib 108 serving as a left positioning guide when the input/output module 10 is pushed into the slot 301 to get connected is formed in the upper portion of the left surface of the input/output module 10. When the adapter 50 is mounted and the input/output module 10 with the narrow width is mounted on the slot 301, the left positioning rib 108 is formed not in the upper portion of the left surface but at a position corresponding to the adapter 50. Of course, when the connection surface of the adapter 50 is its right surface, a positioning rib formed in the input/output module 10 may be a positioning rib formed in the upper portion of the left surface.

The left positioning rib 108 also has a region 108a with a height fitting to the guide wall 303a of which the thickness does not vary and a region 108b with a height fitting to the guide wall 303b of which thickness is narrowed in the direction of the opening. Here, by setting the height of the region 108b to be higher than the height of the region 108a, a large deviation in width is compensated.

Here, by disposing the low region 107a higher than the high region 107b in the right positioning rib 107 and disposing the low region 108a closer to the contact surface with the base than the high region 108b in the left positioning rib 108, the high region 107b and the high region 108b are configured not to interfere with the guide wall 303a of which the thickness does not vary.

Figure 16:
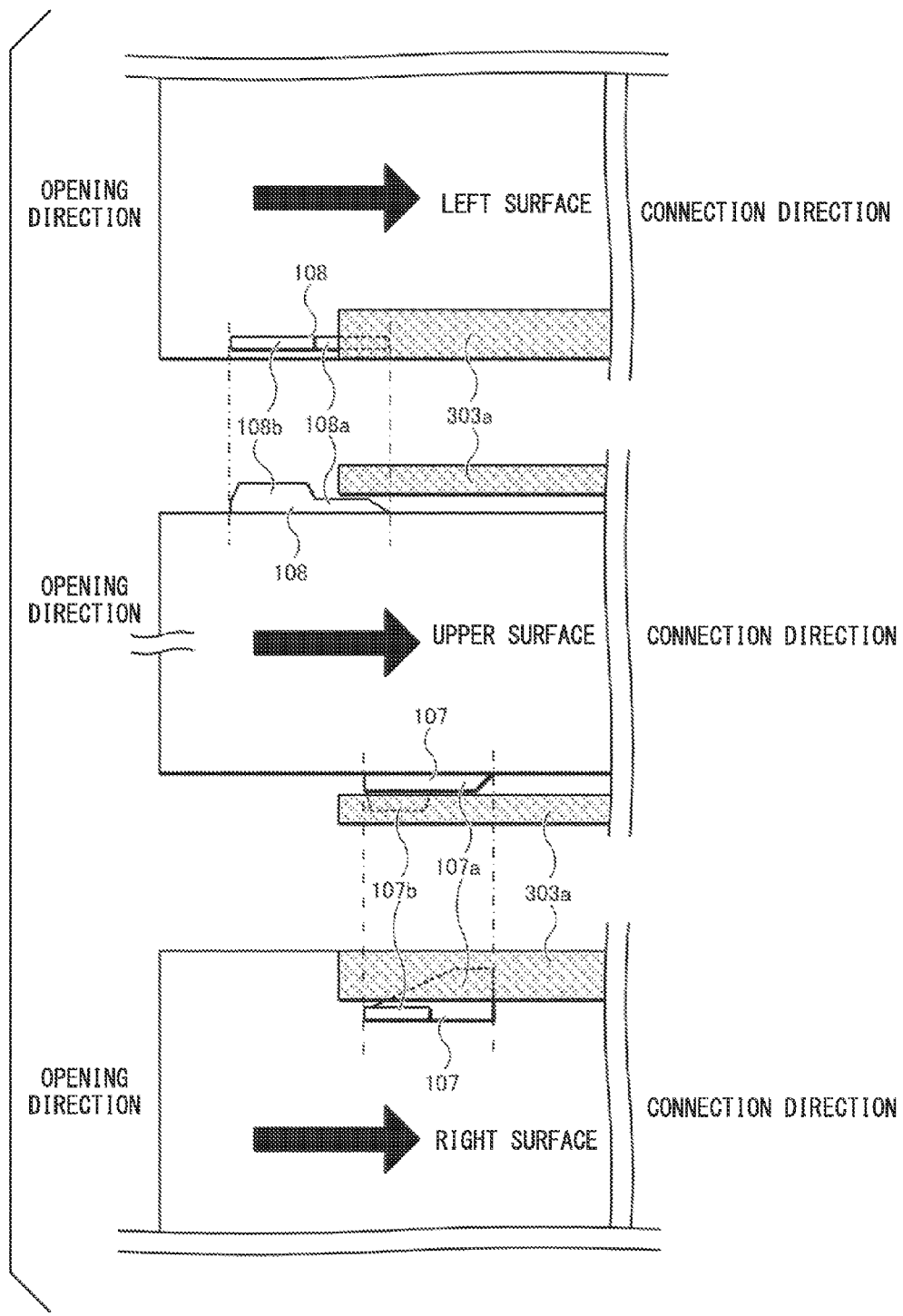
FIG. 16 is a diagram illustrating the guide walls and the positioning ribs of which thicknesses do not vary.

For example, when the input/output module is pushed into the slot 301 to get connected to the slot 301 of the guide wall 303a of which the thickness does not vary, as illustrated in FIG. 16 including a drawing viewed from the upper surface and a drawing viewed from the right surface, the low region 107a of the right positioning rib 107 is configured to fit into the guide wall 303a and the high region 107b is configured not to fit into the lower side of the guide wall 303a.

As illustrated in FIG. 16 including a drawing viewed from the left surface and the drawing viewed from the upper surface, the low region 108a of the left positioning rib 108 is configured to fit into the guide wall 303*a* and the high region 108*b* is configured not to fit into the front of the guide wall 303*a*.

Figure 17:
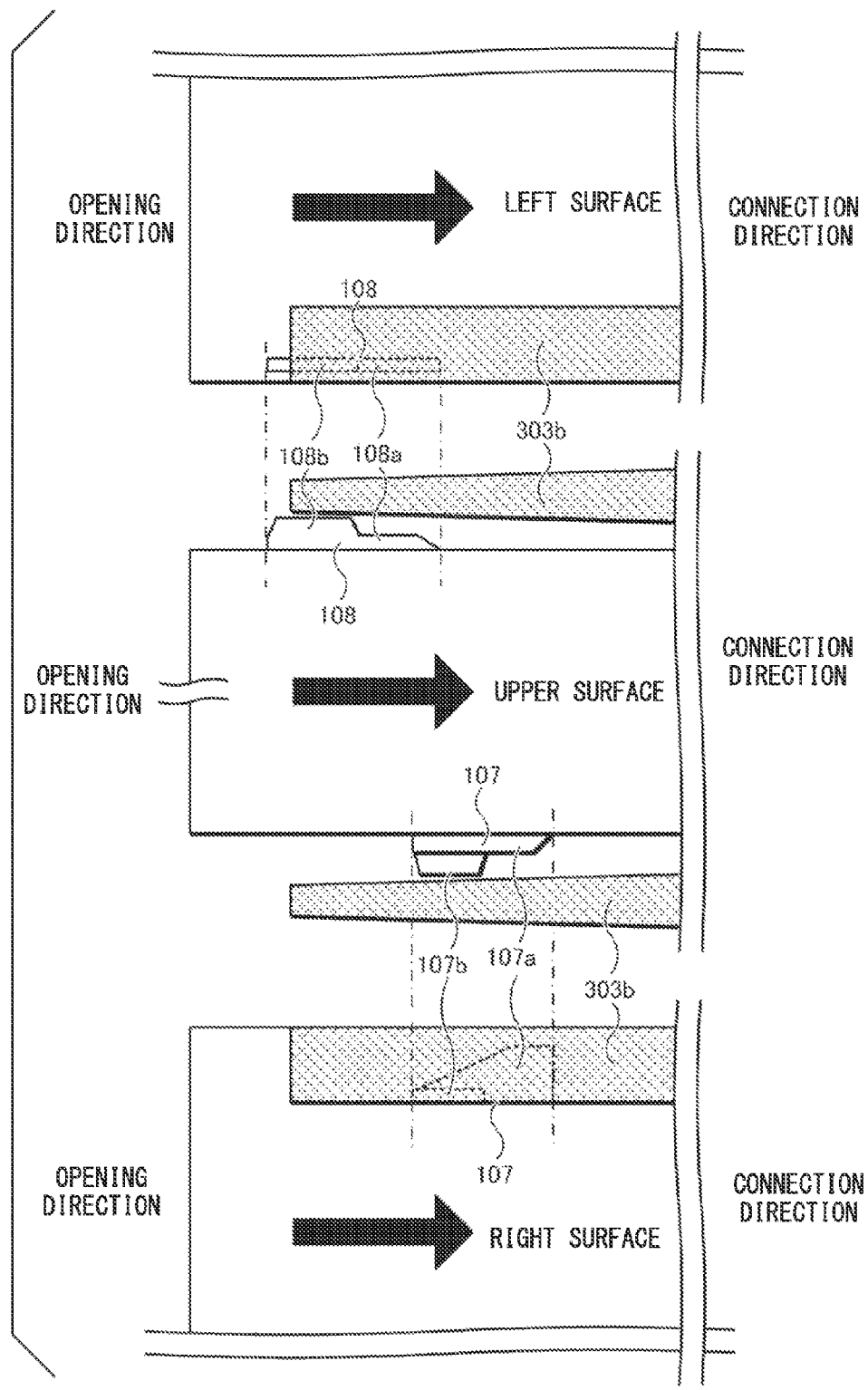
FIG. 17 is a diagram illustrating the guide walls and the positioning ribs of which thicknesses vary.

On the other hand, when the input/output module is pushed into the slot 301 to get connected to the slot 301 of the guide wall 303*b* of which the thickness is narrowed in the direction of the opening, as illustrated in FIG. 17 including a drawing viewed from the upper surface and a drawing viewed from the right surface, the high region 107*b* of the right positioning rib 107 is configured to fit into the guide wall 303*b*. Further, as illustrated in FIG. 17 including a drawing viewed from the left surface and the drawing viewed from the upper surface, the high region 108*b* of the left positioning rib 108 is configured to fit into the guide wall 303*b*. Therefore, the guide wall 303*b* is formed to be longer and higher than the guide wall 303*a*.

As illustrated in FIG. 7, when the plurality of input/output modules 10 are connected via the bases 20, the right positioning rib 107 or the left positioning rib 108 may interfere with the left positioning rib 108 or the right positioning rib 107 of the adjacent input/output module 10 at the time of the rotational connection.

Figure 18:
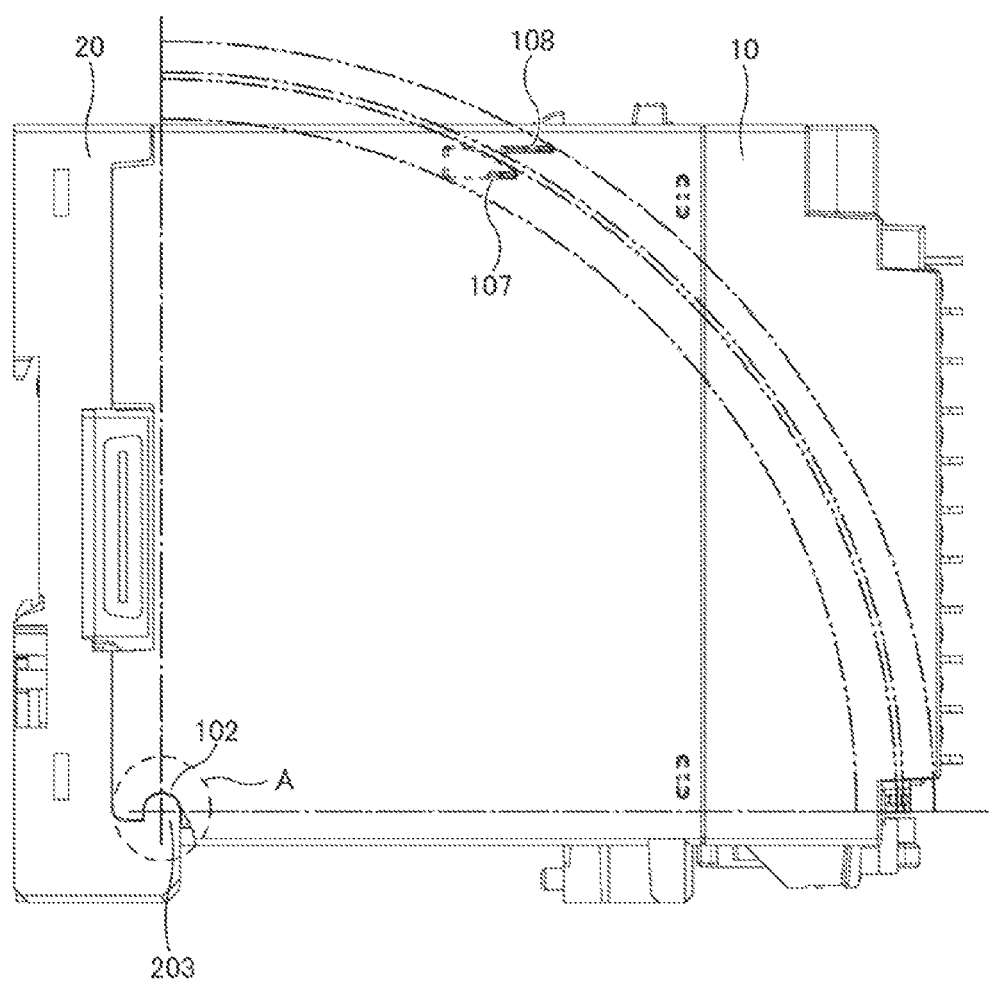
FIG. 18 is a diagram illustrating a positional relation between the right and left positioning ribs.

In the input/output module 10 according to this embodiment, as illustrated in FIG. 18, both of the right positioning rib 107 and the left positioning rib 108 are disposed so that a distance from a rotation point A of the right positioning rib 107 does not overlap a distance from the rotation point A of the left positioning rib 108. Thus, even when the input/output module 10 is rotated to get connected in the connected state to the base 20, it is possible to prevent the positioning rib from interfering with the adjacent input/output module 10.

Figure 19A:
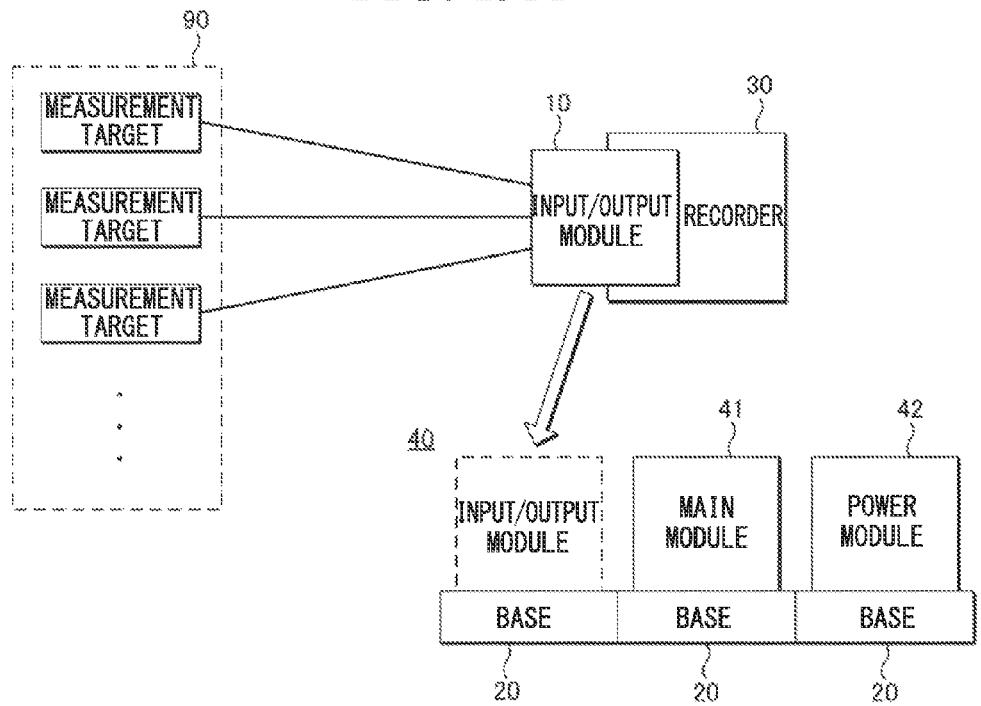
FIG. 19A is a diagram illustrating an application example of the input/output module according to the embodiment.

As described above, the input/output module 10 according to this embodiment is commonly useable in the recorder 30 and the data logger 40. Therefore, for example, as illustrated in FIG. 19A, when measurement signals are acquired from a plurality of measurement targets 90 via the input/output module 10 by the recorder 30 and the measurement signals are also acquired subsequently by the data logger 40, the input/output module 10 may be connected again from the recorder 30 to the base 20 of the data logger 40. Therefore, it is not necessary to install wirings again or to double wirings as in a system of the measurement targets 90 and the recorder 30 and a system of the measurement targets and the data logger 40.

Figure 19B:
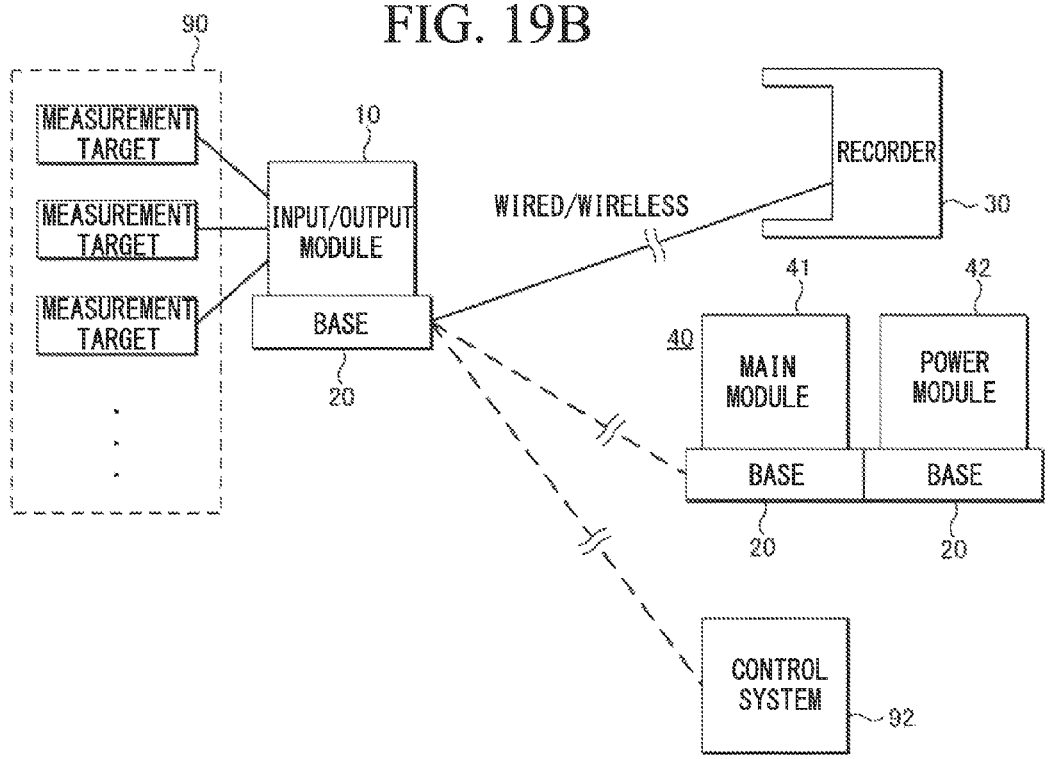
FIG. 19B is a diagram illustrating an application example of the input/output module according to the embodiment.

The input/output module 10 according to this embodiment is usable as a stand alone module. Therefore, for example, as illustrated in FIG. 19B, the input/output module 10 connected to the base 20 may be located near the measurement targets 90 and measurement data may be transmitted to the recorder 30, the data logger 40, a control system 92, or the like in a wired or wireless manner. Therefore, it is not necessary to route wirings from the measurement targets 90 to the recorder 30 or the like. The stand alone usage of the input/output module 10 is also effective when the measurement targets 90 are distributed.

While preferred embodiments of the invention have been described and illustrated above, it should be understood that these are exemplary of the invention and are not to be considered as limiting. Additions, omissions, substitutions, and other modifications may be made without departing from the spirit or scope of the present invention. Accordingly, the invention is not to be considered as being limited by the foregoing description, and is only limited by the scope of the appended claims.

What is claimed is:

1. An input/output module which is configured to achieve at least one of a function of acquiring a measurement signal from a measurement target and a function of outputting data, the input/output module comprising:
   a casing;
   a first positioning rib and a second positioning rib disposed on right and left surfaces of the casing, respectively, the input/output module being pushed into a slot having an upper inner surface and a lower inner surface to get connected;
   a rotational connector disposed on the casing, the rotational connector comprising an arc-shaped notch, the rotational connector being configured to interlock with a connection mechanism of a base to serve as a rotation point so that the input/output module is rotatable to get connected to the base; and
   a latch-shaped fixer configured to fit into a groove formed in at least one of the upper inner surface and the lower inner surface when the input/output module is pushed into the slot to get connected,
   wherein each of the first positioning rib and the second positioning rib comprises a first region which has a first height and functions as a positioner in right and left directions when thicknesses of guide walls formed to the right and left of the slot do not vary, and a second region which has a second height higher than the first height and functions as a positioner in the right and left directions when the thicknesses of the guide walls are narrowed in an opening direction of the slot.

2. The input/output module according to claim 1, wherein the rotational connector is disposed in an upper or a lower portion of the contact surface of the casing with the base, and the second positioning rib in the left surface of the casing and the first positioning rib in the right surface of the casing are disposed at positions at which distances from the rotation point to the second positioning rib in the left surface and the first positioning rib in the right surface are different and the second positioning rib in the left surface and the first positioning rib in the right surface do not overlap each other.

3. The input/output module according to claim 1, wherein when a width of the slot is larger than a width of the input/output module, an adapter with a thickness fitting to a difference between the width of the input/output module and the width of the slot is mountable on a side surface of the casing.

4. The input/output module according to claim 1, further comprising:
   a base contact configured to enable the input/output module to independently stand vertically in cooperation with another base contact of the base when the input/output module is connected to the base.

5. The input/output module according to claim 4, wherein a space is formed in a lower portion by the base contact of the input/output module and the other base contact of the base when the input/output module independently stands vertically.

6. The input/output module according to claim 4, wherein the base contact of the input/output module comprises a screwing member with a shape fitted into a positioning enclosure formed in a lower side of the lower inner surface of the slot when the input/output module is pushed into the slot to get connected.

7. The input/output module according to claim 1, further comprising:
   a connector configured to electrically connect with the base, wherein the connector comprises a ground line, a power line, and a signal line which are arranged upwardly in their order when the rotational connector is disposed in a lower portion of the contact surface of the casing with the base, and the connector comprises the ground line, the power line, and the signal line which are arranged downwardly in their order when the rotational connector is disposed in an upper portion of the contact surface of the casing with the base.

8. The input/output module according to claim 1, further comprising:
   a long plate of which one end is fixed, the long plate being disposed on at least one of the upper surface and the lower surface of the casing,
   wherein the latch-shaped fixer is disposed on the long plate, and
   wherein the long plate comprises a supporter which is closer to the contact surface of the casing with the base than the latch-shaped fixer and is configured to serve as a rotation point, and a pusher for unfixing the input/output module from the slot, and the pusher is disposed farther from the contact surface of the casing with the base than the latch-shaped fixer.

9. An input/output module which is configured to achieve at least one of a function of acquiring a measurement signal from a measurement target and a function of outputting data, the input/output module comprising:
   a casing; and
   a first positioning rib and a second positioning rib disposed on right and left surfaces of the casing, respectively, the input/output module being pushed into a slot having an upper inner surface and a lower inner surface to get connected,
   wherein each of the first positioning rib and the second positioning rib comprises a first region which has a first height and functions as a positioner in right and left directions when thicknesses of guide walls formed to the right and left of the slot do not vary, and a second region which has a second height higher than the first height and functions as a positioner in the right and left directions when the thicknesses of the guide walls are narrowed in an opening direction of the slot,
   the first region is disposed higher than the second region in a height direction of the casing, or the first region is disposed closer to the contact surface of the casing with a base than the second region.

10. The input/output module according to claim 9, further comprising:
   a rotational connector disposed on the casing, the rotational connector comprising an arc-shaped notch, the rotational connector being configured to interlock with a connection mechanism of the base to serve as a rotation point so that the input/output module is rotatable to get connected to the base; and
   a latch-shaped fixer configured to fit into a groove formed in at least one of an upper inner surface and a lower inner surface when the input/output module is pushed into the slot to get connected.

* * * * *